(12) United States Patent
Jow et al.

(10) Patent No.: US 9,653,533 B2
(45) Date of Patent: May 16, 2017

(54) MULTI-LAYER INTERCONNECTED SPIRAL CAPACITOR

(71) Applicant: QUALCOMM Incorporated, San Diego, CA (US)

(72) Inventors: Uei-Ming Jow, San Diego, CA (US); Young Kyu Song, San Diego, CA (US); Jong-Hoon Lee, San Diego, CA (US); Xiaonan Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 14/625,484

(22) Filed: Feb. 18, 2015

(65) Prior Publication Data

US 2016/0240606 A1 Aug. 18, 2016

(51) Int. Cl.
| | |
|---|---|
| *H01L 23/52* | (2006.01) |
| *H01L 49/02* | (2006.01) |
| *H01L 23/522* | (2006.01) |
| *H01G 4/33* | (2006.01) |
| *H01L 23/64* | (2006.01) |

(52) U.S. Cl.
CPC ............... *H01L 28/86* (2013.01); *H01G 4/33* (2013.01); *H01L 23/5223* (2013.01); *H01L 23/642* (2013.01); *H01L 28/60* (2013.01)

(58) Field of Classification Search
CPC .................................................. H01L 23/5223
USPC ......................................................... 257/534
See application file for complete search history.

(56) References Cited

U.S. PATENT DOCUMENTS

| | | | |
|---|---|---|---|
| 6,297,524 B1 | 10/2001 | Vathulya et al. | |
| 6,661,079 B1 | 12/2003 | Bikulcius | |
| 7,838,919 B2 | 11/2010 | Okamoto et al. | |
| 2006/0061934 A1* | 3/2006 | Mou ...................... | H01G 4/252 361/305 |
| 2007/0057344 A1 | 3/2007 | Lee | |
| 2007/0102788 A1 | 5/2007 | Yang et al. | |

(Continued)

FOREIGN PATENT DOCUMENTS

DE 10206918 A1 8/2003

OTHER PUBLICATIONS

Partial International Search Report—PCT/US2016/016001—ISA/EPO—May 17, 2016.

(Continued)

*Primary Examiner* — Kenneth Parker
*Assistant Examiner* — Warren H Kilpatrick
(74) *Attorney, Agent, or Firm* — Kenneth K. Vu; Joseph Agusta

(57) ABSTRACT

An upper planar capacitor is spaced above a lower planar capacitor by a dielectric layer. A bridged-post inter-layer connector couples the capacitances in parallel, through first posts and second posts. The first posts and second posts extend through the dielectric layer, adjacent the upper and lower planar capacitors. A first level coupler extends under the dielectric layer and couples the first posts together and to a conductor of the lower planar capacitor, and couples another conductor of the lower planar capacitor to one of the second posts. A second level coupler extends above the dielectric layer, and couples the second posts together and to a conductor of the upper planar capacitor, and couples another conductor of the upper planar capacitor to one of the first posts.

30 Claims, 10 Drawing Sheets

(56) References Cited

U.S. PATENT DOCUMENTS

| | | |
|---|---|---|
| 2007/0126078 A1 | 6/2007 | Huang et al. |
| 2010/0265009 A1 | 10/2010 | Horng et al. |
| 2011/0267194 A1* | 11/2011 | Hong ............... H01P 5/185 340/572.7 |
| 2012/0326270 A1 | 12/2012 | Thompson et al. |
| 2013/0277803 A1 | 10/2013 | Pagani |
| 2014/0103490 A1 | 4/2014 | Kumar et al. |
| 2014/0203404 A1 | 7/2014 | Choi et al. |
| 2014/0252543 A1 | 9/2014 | Li et al. |
| 2014/0374881 A1 | 12/2014 | Lu et al. |

OTHER PUBLICATIONS

International Search Report and Written Opinion—PCT/US2016/016001—ISA/EPO—Oct. 21, 2016.

* cited by examiner

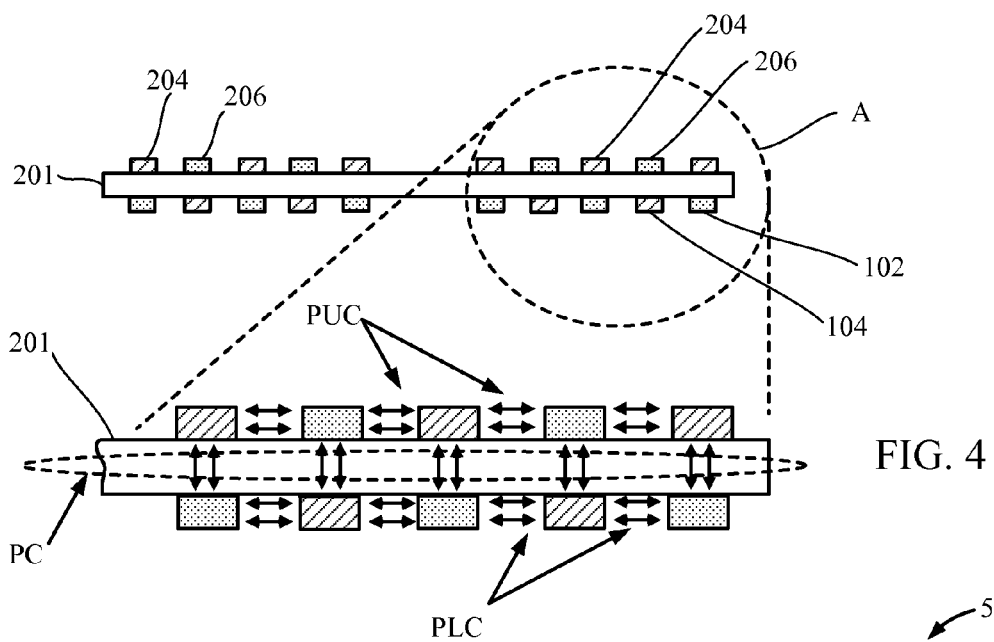
FIG. 4
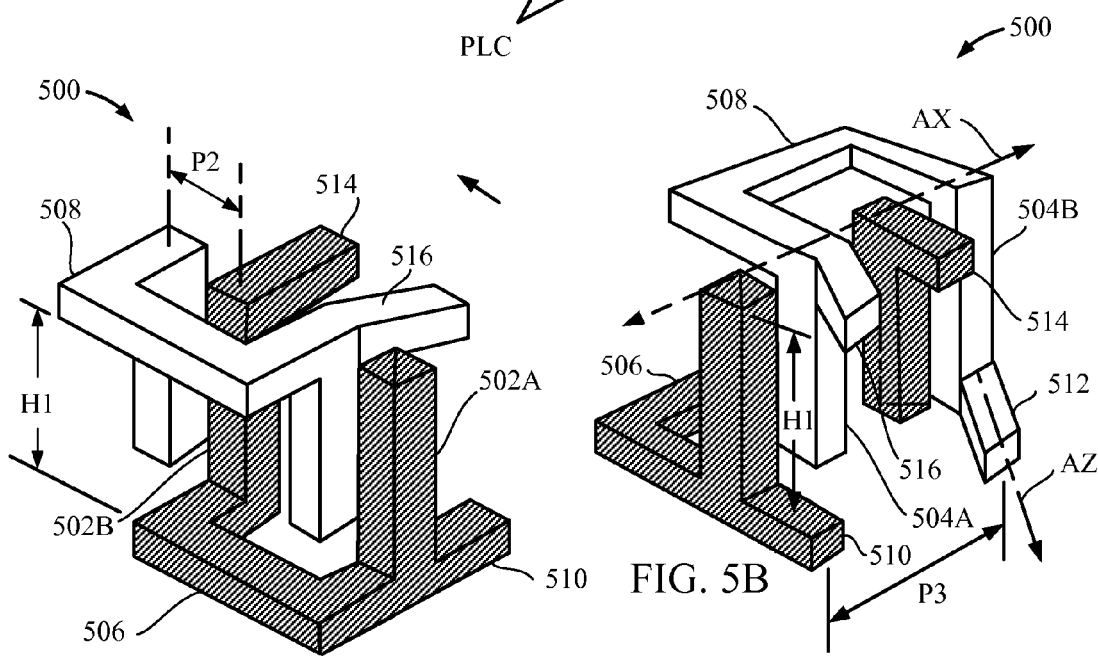
FIG. 5A
FIG. 5B
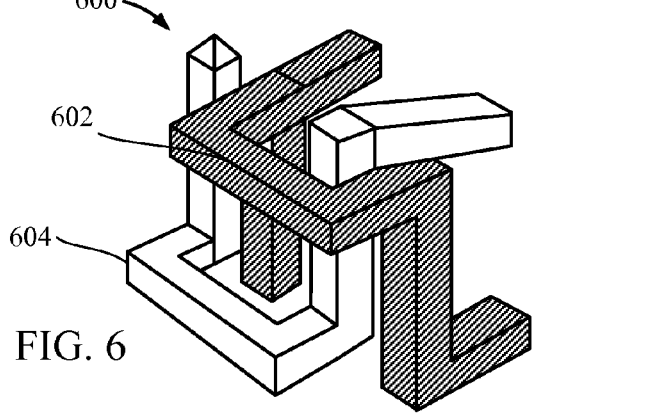
FIG. 6

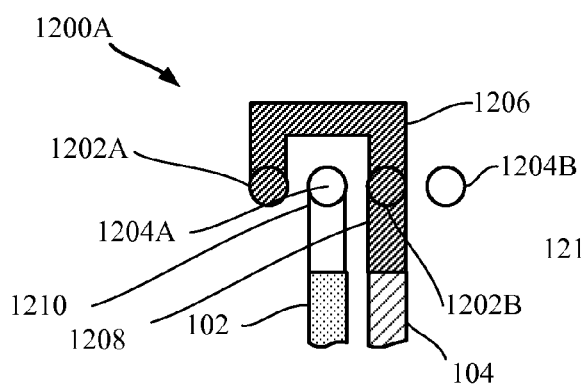
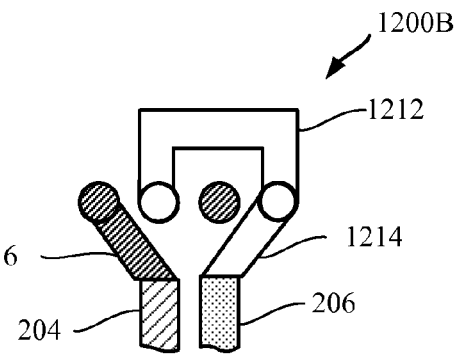
FIG. 12A        FIG. 12B
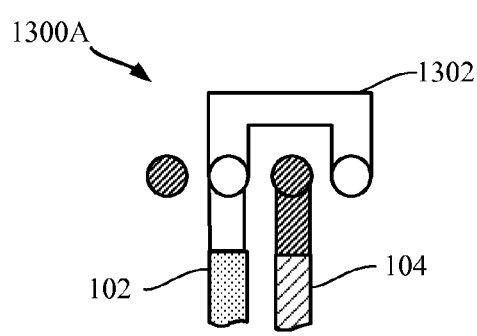
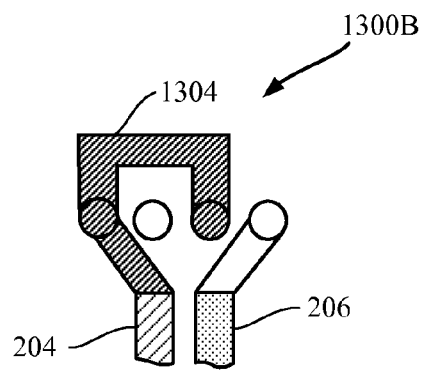
FIG. 13A        FIG. 13B
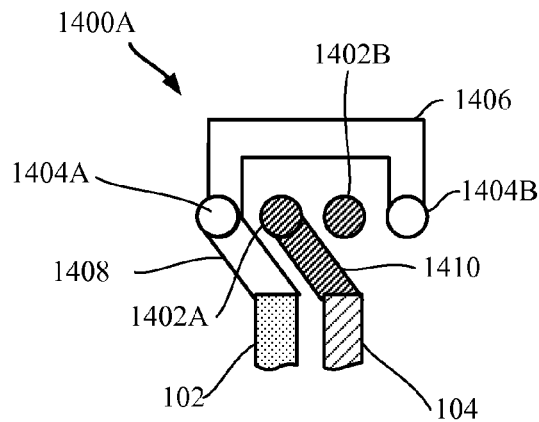
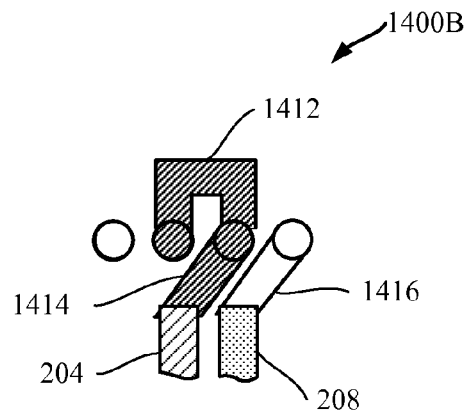
FIG. 14A        FIG. 14B

MULTI-LAYER INTERCONNECTED SPIRAL CAPACITOR

FIELD OF DISCLOSURE

The present application is generally related to capacitors for integrated circuit devices.

BACKGROUND

There are various known conventional structures for capacitors in integrated circuit (IC) devices. One known conventional structure is a planar capacitor having parallel conductors on a dielectric surface, with their respective sidewalls having a facing area that establishes capacitance. There are various shortcomings of such structures. These can include an inherently high cost of IC area per unit of capacitance, difficulty in obtaining a high ratio of capacitance to resistance (known as "quality factor"), and parasitic inductance.

Another known conventional structure for IC capacitors is a parallel plate capacitor, formed of a stack of alternating metal and dielectric layers. There are various shortcomings of such parallel plate IC capacitors. Among these are inherently high costs of IC area per unit of capacitance.

SUMMARY

This Summary points out some disclosed features. The Summary is not, and is not intended to be an exclusive or exhaustive description of the disclosed aspects. Additional aspects will be understood by persons skilled in the art upon reading the following detailed description and viewing the drawings that form a part thereof. Inclusion and non-inclusion in the Summary of aspects disclosed in the detailed description and drawings, and defined by the appended claims, is not reflective of relative importance.

Examples of multi-layer capacitors are disclosed that can include a first level planar capacitor, which may comprise a first level first trace and a first level second trace, a dielectric layer, arranged over the first level planar capacitor, and a second level planar capacitor, which may be arranged over the dielectric layer and may comprise a second level first trace and a second level second trace. In an aspect, a bridged-post inter-layer interconnect may include at least two first posts and at least two second posts, extending through the dielectric layer, adjacent the first level planar capacitor and the second level planar capacitor. In a further aspect, the bridged-post inter-layer interconnect may include a first level first post coupler and a first level second post coupler, under the dielectric layer, and a second level first post coupler and a second level second post coupler, over the dielectric layer. In an aspect, the first level first post couple may be configured to couple the at least two first posts together and to the first level first trace, and the first level second post coupler may be configured to couple the first level second trace to at least one of the at least two second posts. In another aspect, the second level second post coupler may be configured to couple the at least two second posts together and to the second level first trace, and the second level first post coupler may be configured to couple the second level first trace to at least one of the at least two first posts.

Examples of multi-layer capacitors are disclosed that can include a first level planar capacitor, a second level planar capacitor, and a bridged-post inter-layer interconnector. In an aspect, the first level planar capacitor may comprise a first level first trace and a first level second trace, configured above a plane, and the second level planar capacitor may be spaced above the first level planar capacitor by a dielectric layer, and may comprise a second level first trace and a second level second trace. In an aspect, the second level first trace may be aligned above the first level first trace to form a first parallel plate capacitor, and the second level second trace may be aligned above the first level second trace to form a second parallel plate capacitor. In an aspect, the bridged-post inter-layer interconnector may include at least two first posts and at least two second posts, and the at least two first posts and the at least two first posts may be configured to extend normal to the plane and through the dielectric layer. The bridged-post inter-layer interconnector may include a first level first post coupler, arranged under the dielectric layer, which may be configured to couple the at least two first posts together and to the first level first trace. The bridged-post inter-layer interconnector may include a first level second post coupler, arranged under the dielectric layer, which may configured to couple the first level second trace to at least one of the at least two second posts. The bridged-post inter-layer interconnector, in an aspect, may further include a second level second post coupler, which may be arranged above second dielectric layer, and which may be configured to couple the at least two second posts together and to the second level first trace. In an aspect, the bridged-post inter-layer interconnect may include a second level first post coupler, which may be arranged above second dielectric layer, and may be configured to couple the second level second trace to at least one of the at least two first posts.

Other example multi-layer capacitors that are disclosed can comprise a capacitor stack, which may include odd level spiral capacitors and even level spiral capacitors, and each of the even level spiral capacitors may be spaced above a corresponding one of the odd level spiral capacitors. In an aspect, each of the odd level spiral capacitors may include an odd level first spiral winding and an odd level second spiral winding, and the odd level first spiral winding and the odd level second spiral winding may be interwound about a winding axis. In a related aspect, each of the even level spiral capacitors may include an even level first spiral winding and an even level second spiral winding. In an aspect, the even level first spiral winding and the even level second spiral winding may be interwound about the winding axis, in a tracking alignment with the odd level first spiral winding and the odd level second spiral winding of an underlying one of the odd level spiral capacitors. In an aspect, arranged in the capacitor stack me be a bridged-post inter-layer interconnect, which may comprise at least two first posts, and at least two second posts. The at least two first posts and the at least two second posts, in an aspect, may be configured to extend through the respective dielectric layers. In a further aspect, the bridged-post inter-layer interconnect may further comprise, adjacent each of the odd level spiral capacitors, an odd level first post coupler and an odd level second post coupler. The odd level first post coupler, in an aspect, may be configured to couple the at least two first posts together and to the odd level first spiral winding of the odd level spiral capacitor. In another aspect, the odd level second post coupler may be configured to couple the odd level second spiral winding of the odd level spiral capacitor to at least one of the at least two second posts. In an aspect, adjacent each of the even level spiral capacitors may be an even level first post coupler and an even level second post coupler. The even level second post coupler, in an aspect, may be configured to couple the at least two second posts together and to the even level first spiral winding of the even level spiral capacitor. In an aspect, the even level first post coupler may be configured to couple the even level second spiral winding of the even level spiral capacitor to at least one of the at least two first posts.

Other example multi-layer capacitors that are disclosed can comprise a first level planar capacitor, comprising a first level first trace and a first level second trace, each extending above a plane, and a second level planar capacitor, spaced above the first level planar capacitor by a dielectric layer, and comprising a second level first trace and a second level second trace. In an aspect, the second level first trace may be aligned above the first level first trace to form a first parallel plate capacitor, and the second level second trace may be aligned above the first level second trace to form a second parallel plate capacitor. In an aspect, a third level planar capacitor may be spaced above the second level planar capacitor by a second dielectric layer, and may comprise a third level first trace and a third level second trace. In an aspect, the third level first trace may be aligned above the second level first trace to form a third parallel plate capacitor, and the third level second trace may be aligned above the second level second trace to form a fourth parallel plate capacitor. In an aspect, a fourth level planar capacitor may be spaced above the third level planar capacitor by a third dielectric layer. The fourth level planar capacitor may include, in an aspect, a fourth level first trace and a fourth level second trace. In an aspect, the fourth level first trace may be aligned above the third level first trace to form a fifth parallel plate capacitor, and the fourth level second trace may be aligned above the third level second trace to form a sixth parallel plate capacitor. According to an aspect, example multi-layer capacitors may include means for coupling, in parallel, the first level planar capacitor, the second level planar capacitor, the first parallel plate capacitor, the second parallel plate capacitor, the third parallel plate capacitor, the fourth parallel plate capacitor, the fifth parallel plate capacitor, and the sixth parallel plate capacitor.

BRIEF DESCRIPTION OF THE DRAWINGS

The accompanying drawings are presented to aid in the description of embodiments of the invention and are provided solely for illustration of the embodiments and not limitation thereof.

FIG. 4 shows a side cut-view, from the FIG. 1 and FIG. 3 cut plane 3-3, with an expanded region diagrammed with representative electric field lines associated with various example capacitances.

FIG. 5A shows a perspective view of one rotation of a bridged-post inter-layer interconnector for two-layer multi-layer interconnected capacitors according to various aspects.

FIG. 5B show a perspective view of another rotation of the FIG. 5A bridged-post inter-layer interconnector for two-layer multi-layer interconnected capacitors according to various aspects.

FIG. 6 show a perspective view of one alternative bridged-post inter-layer interconnector for two-layer multi-layer interconnected capacitors according to various aspects.

FIG. 12A shows a plan view of a portion of one alternative structure for the bridged-post inter-layer interconnect of FIGS. 1-3 and 7.

FIG. 12B shows a plan view of another portion 1200B of the alternative bridged-post inter-layer interconnect shown in part in FIG. 12A.

FIG. 13A shows a plan view of a portion of one modification of the portion of the alternative bridged-post inter-layer interconnect shown in FIG. 12A.

FIG. 13B shows a plan view of a portion of one modification of the portion of the alternative bridged-post inter-layer interconnect shown in FIG. 12B.

FIG. 14A shows a plan view of a portion of an alternative bridged-post inter-layer interconnect as an alternative to certain structure in FIGS. 12A and 13A.

FIG. 14B shows a plan view of another portion of an alternative bridged-post inter-layer interconnect as an alternative to certain structure in FIGS. 12B and 13B.

DETAILED DESCRIPTION

Figure 1:
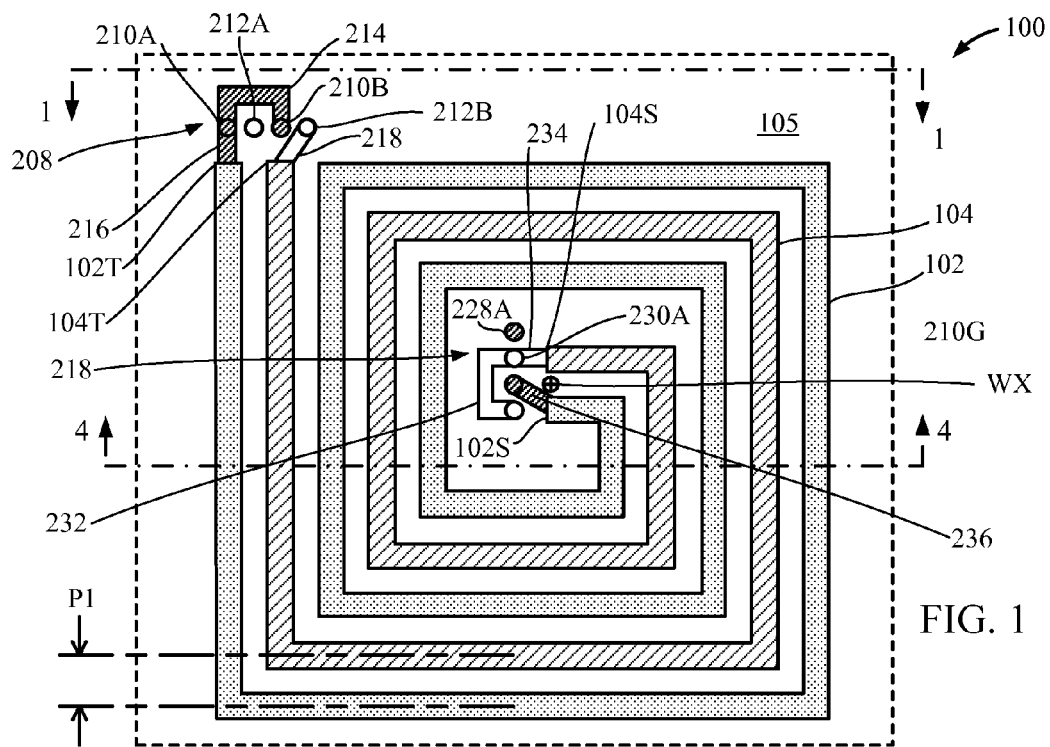
FIG. 1 shows a plan view of one example first layer of one example interconnected multi-layer capacitor according to one or more aspects.

Aspects of the invention are disclosed in the following description and related drawings directed to specific exemplary aspects. Alternate aspects may be devised without departing from the scope of the invention. In certain described example implementations, instances are identified where various component structures and portions of operations can be taken from known, conventional techniques, and then arranged in accordance with one or more exemplary embodiments. In such instances, internal details of the known, conventional component structures and/or portions of operations are omitted to help avoid potential obfuscation of inventive concepts.

The terminology used herein is only for the purpose of describing particular embodiments and is not intended to be limiting of embodiments of the invention.

The word "exemplary," as used herein, means "serving as an example, instance, or illustration." Accordingly, the term "exemplary aspect," as used herein, means an embodiment serving as an example, instance, or illustration, but that is not necessarily preferred or advantageous over other aspects. Likewise, it will be understood that the term "aspects of the invention," as used herein in reference to a feature, advantage or mode of operation, does not mean that all aspects of the invention include the discussed feature, advantage or mode of operation.

As used herein, the singular forms "a", "an" and "the" are intended to include the plural forms as well, unless the context clearly indicates otherwise. The terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. The terms "comprising" and "comprises" each encompasses, without limitation, "consisting of" and "consisting essentially of."

Certain aspects are described in terms of operations and steps, for example, in or relating to various processes of design and fabrication. It will be understood, that except in instances where explicitly stated or where made clear from a particular context, that the described order of such operations and steps is only for purposes of example, and is not necessarily limiting of the order of operations or steps that may be applied in practices according to various exemplary aspects Further, certain aspects are described in terms of operations, steps, actions and sequences of operations, steps and actions that can performed by or under control of, for example, a computing device or elements of a computing device. It will be understood by persons of ordinary skill, upon reading this disclosure, that such operations, steps, actions, sequences and other combinations therefore can be performed by, or under control of specific circuits (e.g., application specific integrated circuits (ASICs)), by program instructions being executed by one or more processors, or by a combination of both.

Accordingly, it will be appreciated by such persons that operations, steps, actions, sequences and other combinations thereof can be embodied entirely within any form of computer readable storage medium having stored therein a corresponding set of computer instructions that, upon execution, can cause an associated processor to perform, directly or indirectly, operations, steps, actions, sequences and other combinations described herein. Thus, the various aspects may be embodied in a number of different forms, all of which are contemplated to be within the scope of the claimed subject matter.

One example multi-layer interconnected capacitor can include a stacking of a second layer on a first layer. The first layer may include a first level first trace and a first level second trace extending along parallel paths over a top surface of a support. The support, for example, may be a dielectric layer. The support may, alternatively, be a bottom surface of a dielectric having a top surface opposite the bottom surface. The second layer may include a second level first trace and a second level second trace, spaced above, for example, by a dielectric layer, the first level first trace and first level second trace. In an aspect, the second level first trace may be in a tracking alignment with the first level first trace and the second level second trace may be in a tracking alignment with the first level second trace.

In an aspect, the second level first trace overlaying, in a tracking alignment, the first level first trace can establish a first parallel plate capacitor. Likewise, the second level second trace overlaying, in a tracking alignment, the first level second trace can establish a second parallel plate capacitor. In a further aspect, the first level first trace and the first level second trace can be configured with respective facing side surfaces to establish, on the top surface of the dielectric, a first planar capacitor. Similarly, the second level first trace and the second level second trace can be configured with respective facing surfaces to establish, on the bottom surface of the dielectric, a second planar capacitor.

In an aspect, the first level first trace may include a first level first trace start, and the first level second trace may include a first level second trace start. In a further aspect, the first level second trace start may be proximal to the first level first trace start. In a related aspect, the second level first trace may include a second level first trace start, and the second level first trace start may be laterally aligned above the first level first trace start. In a further aspect, the second level second trace may include a second level second trace start, and the second level second trace start may be laterally aligned above the first level second trace start.

In a further aspect, the first level first trace may be configured to extend from the first level first trace start to a first level first trace termination, and the first level second trace may be configured to extend from the first level second trace start to a first level second trace termination. Likewise, the second level first trace may be configured to extend from the second level first trace start to a second level first trace termination, and the second level second trace may configured to extend from the second level second trace start to a second level second trace termination. The first level second trace termination may be proximal to the first level first trace termination. In an aspect, the second level first trace termination may be laterally aligned above the first level first trace termination, and the second level second trace termination may be laterally aligned above the first level second trace termination.

In an aspect, a bridged-post interlayer interconnect can extend through the dielectric layer and can include particular structure to electrically connect, with low resistance, the first level first trace to the second level second trace, and likewise electrically connect the first level second trace to the second level second trace. In an aspect, the bridged-post interlayer interconnect can establish a total capacitance that includes the first parallel plate capacitor, the second parallel plate capacitor, the first planar capacitor and the second planar capacitor.

In a further aspect, the first level first trace may be a first level first spiral winding, which may wind around a winding axis, and the first level second conductor may be a first level second spiral winding that may be interwound, around the same winding axis, with the first level first spiral winding. In a related aspect, the second level first trace may be a second level first spiral winding, in a tracking alignment with the first level first spiral winding, and a second level second spiral winding, in a tracking alignment with the first level second spiral winding.

FIG. 1 shows a plan view of one example first layer 100 for various example multi-layer interconnected capacitors according to one or more aspects. The first layer 100 may include a first level spiral capacitor (visible, but not separately numbered) comprising a first level first spiral winding 102 that winds, from a first level first spiral winding start 102S, around a winding axis WX, to a first level first spiral winding termination 102T. The first level spiral capacitor may further include a first level second spiral winding 104 that winds around the same winding axis WX, parallel to and interwound with the first level first spiral winding 102. The first level second spiral winding has a first level second spiral winding start 104S and a first level second spiral winding termination 104T. This above-described first level spiral capacitor will be referred to as the "first level spiral capacitor 102/104" (a label not explicitly marked on FIG. 1). The first level spiral capacitor 102/104 may be supported on a top surface 105A of a dielectric 105. Alternatively, the first level spiral capacitor 102/104 may be supported on a bottom surface (not visible in FIG. 1) of a dielectric layer (not visible in FIG. 1) supporting a capacitor stack, having at least two spiral capacitors, similarly configured and arranged in an overlaying manner (not visible in FIG. 1).

In an aspect, a two-layer multi-layer interconnected capacitor may be formed by a stack that can include a first level planar capacitor such as the FIG. 1 first level spiral capacitor 102/104 and a second level planar capacitor, spaced above the first level planar capacitor by a dielectric layer. The second level planar capacitor can include a second level first trace and a second level second trace. The second level first trace and a second level second trace may be configured identically to the first level first trace and first level second trace. In an aspect, the second level first trace can be aligned with the first level first trace to form (in combination with the dielectric layer) a first parallel plate capacitor, and the second level second trace can be aligned with the first level second trace to form (also in combination with the dielectric layer) a second parallel plate capacitor.

Figure 2:
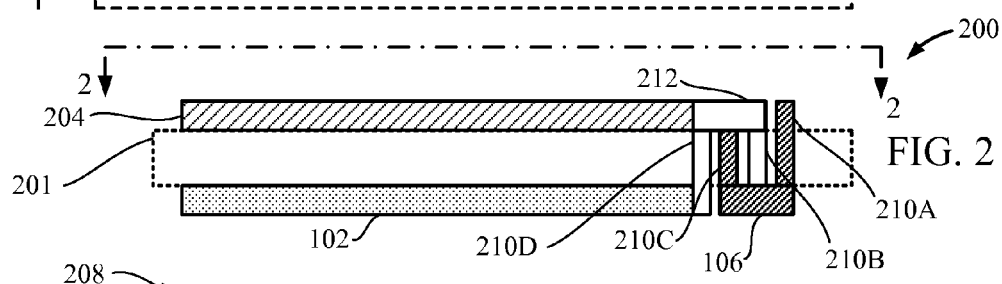
FIG. 2 shows a front projection, viewed from the FIG. 1 projection plane 1-1, of one example two-layer multi-layer interconnected capacitor according to various aspects, using the FIG. 1 example first layer and one example second layer.
Figure 3:
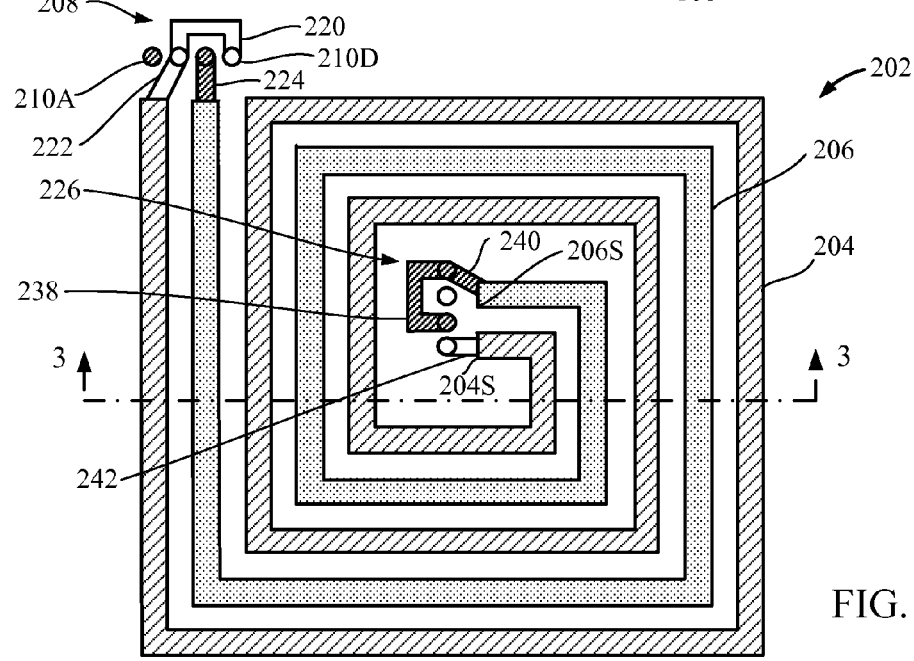
FIG. 3 shows a plan view of the second layer of the FIG. 2 two-layer multi-layer interconnected capacitor according to various aspects, viewed from the FIG. 2 drill-down top projection plane 2-2, with intervening dielectric support rendered transparent.

FIG. 2 shows a front projection, viewed from the FIG. 1 front projection plane 1-1, of a two-layer multi-layer interconnected capacitor 200 according to one or more aspects. FIG. 3 shows a plan view of the second layer 202 of the FIG. 2 two-layer multi-layer interconnected capacitor 200, viewed from the FIG. 2 top projection plane 2-2. For brevity, the phrase "multi-layer interconnected" will be alternatively referenced in abbreviated form as "MLI." It will be understood that "MLI" is only an arbitrary abbreviation, having no additive or inherent meaning and importing no meaning into this disclosure.

Referring to FIGS. 2 and 3, in an aspect, the two-layer MLI capacitor 200 may include a stacking on the FIG. 1 first layer 100 of a second level spiral capacitor, spaced above the first level spiral capacitor 102/104 by a dielectric layer 201. The second level spiral capacitor can be formed, for example, of a second level first spiral winding 204 that winds around the winding axis WX and a second level second spiral winding 206 that also winds around that winding axis WX, parallel to and interwound with the second level first spiral winding 204. This described second level spiral capacitor will be referred to as the "second level spiral capacitor 204/206" (a label mot explicitly marked on FIG. 2). In an aspect, the second level first spiral winding 204 can extend in a tracking alignment with the first level first spiral winding 102 to form a first parallel plate capacitor (visible in FIG. 2 but not separately labeled). Similarly, the second level second spiral winding 206 can extend in a tracking alignment with the first level second spiral winding 104 to form a second parallel plate capacitor (visible in FIG. 2 but not separately labeled).

Referring to FIGS. 2 and 3 the second level first spiral winding 204 has a second level first spiral winding start 204S, and a second level first spiral winding termination 204T. The second level second spiral winding 206 has a second level second spiral winding start 206S and a second level second spiral winding termination 206T. Since the second level first spiral winding 204 can be in a tracking alignment with the first level first spiral winding 102, the second level first spiral winding start 204S can be substantially aligned with the first level first spiral winding start 102S, and the second level first spiral winding termination 204T can be substantially aligned with the first level first spiral winding termination 102T. Likewise, the second level second spiral winding start 206S can be substantially aligned with the first level second spiral winding start 104S, and the second level second spiral winding termination 206T can be substantially aligned with the first level second spiral winding termination 104T, Referring to FIGS. 1-3, a bridged-post inter-layer interconnect 208 can extend through the dielectric layer 201 and electrically connect, with novel low resistance, low inductance structure, the first level first spiral winding 102 to the second level second spiral winding 206, and the first level second spiral winding 104 to the second level first spiral winding 204. In an aspect, the bridged-post inter-layer interconnect 208 can include a plurality of posts. For brevity, the term "post," as used herein, means "conducting post," except where otherwise expressly stated or made clear in a particular context to mean otherwise.

In an aspect, the posts of the bridged-post inter-layer interconnect 208 may comprise at least two "first posts" such as, for example, the first post 210A and another first post 210B, and at least two "second posts" such as, for example, the second post 212A and another second post 212B. The first post 210A and the first post 210B can be collectively referred to as "first posts 210" (a label that does not separately appear in the figures). Likewise, the second post 212A and the second post 212B can be collectively referred to as "second posts 212" (a label that does not separately appear in the figures). For later description, the first posts 210 and the second posts 212 will be collectively referenced, alternatively, as "interconnect posts 210/212" and as "first interconnect posts 210/212" (not appearing as a separate label in the figures). In an aspect, the interconnect posts 210/212 may be arranged to extend through the dielectric layer 201 in a location proximal, in the first layer 100, to the first level first spiral winding termination 102T and the first level second spiral winding termination 104T. Examples of "proximal" are described in greater detail in later sections.

The bridged-post inter-layer interconnect 208 may include, in the first level 100, a first level first post bridge 214 and a first level first post stub 216. The first level first post bridge 214 may be configured to couple lower ends (visible, but not separately labeled) of the first posts 210 together. The first level first post bridge 214 and the first level first post stub 216 can serve, in combination, as a first level first post coupler, which may couple lower ends (visible in FIGS. 1 and 2) of the first posts 210 together and to the first level first spiral winding termination 102T.

The bridged-post inter-layer interconnect 208 may include, also in the first layer 100, a first level second post stub 218. The first level second post stub 218 can serve as a first level second post coupler, that may couple the first level second spiral winding termination 104T to at least one of the second posts 212, for example, the second post 212A.

Referring to FIG. 1, the bridged-post inter-layer interconnect 208 may include, in the second layer 202, a second level second post bridge 220 and a second level second post stub 222. The second level second post bridge 220 may be configured to couple upper ends (visible, but not separately labeled) of the second posts 212 together. The second level second post bridge 220 and the second level second post stub 222 can serve, in combination, as a second level second post coupler, which may couple upper ends (visible in FIGS. 1 and 2) of the second posts 212 together and to the second level first spiral winding termination 204T.

The bridged-post inter-layer interconnect 208 may include, also in the second layer 202, a second level first post stub 224. The second level first post stub 224 can serve as a second level first post coupler, that may couple the second level second spiral winding termination 206T to at least one of the first posts 210, for example the first post 210B.

As described, interconnect posts 210/212 may be arranged to extend through the dielectric layer 201 in a location that is proximal, in the first layer 100, to the first level first spiral winding termination 102T and the first level second spiral winding termination 104T. In an aspect, "proximal" may be in relation to the center-to-center spacing between adjacent sections of the parallel conductors. For example, referring to FIG. 1, the first level first spiral winding 102 and the first level second spiral winding 104 may have a center-to-center spacing or conductor pitch P1. In an aspect, the first interconnect posts 210/212 may extend into the first layer 100 at a position spaced by a distance (visible in FIG. 1, but not separately labeled) from the respective first ends of the first level first spiral winding 102 and of the first level second spiral winding 104 that can be approximately equal to, or in a range comparable to, the conductor pitch P1. One example range can be the range spanning from approximately one-half of P1 to approximately P1. Referring to FIG. 3, the above-described positioning of the first interconnect posts 210/212 can apply, identically, to their position in the second layer 202 relative to the second level first spiral winding termination 204T and the second level second spiral winding termination 206T.

Referring to FIGS. 1 and 3, the respective positions of the first interconnect posts 210/212, in combination with structure including the two first posts 210 coupled by the first level first post bridge 214 and the two second posts 212 coupled by the second level second post bridge 220 can provide, low inductance, low resistance coupling between the first level spiral capacitor 102/104 and the second level spiral capacitor 204/206.

In an aspect, the bridged-post inter-layer interconnect 208 may be a "first" bridged-post inter-layer interconnect 208, and the FIG. 2 two-layer MLI capacitor 200 may include a second bridged-post inter-layer interconnect 226. For consistency in labeling, the first posts 210 can be alternatively referenced as "first interconnect first posts" 210, and the second posts 212 can be alternatively referenced as "first interconnect second posts" 212. The second bridged-post inter-layer interconnect 226 may comprise a second interconnect first post 228A, another second interconnect first post 228B, a second interconnect second post 230A and another second interconnect second post 230B. The second interconnect first post 228A and the second interconnect first post 228B can be alternatively referenced as "second interconnect first posts 228" (not appearing as a separate label in the figures). The second interconnect second post 230A and the second interconnect second post 230B can be alternatively referenced as "second interconnect second posts 230" (not appearing as a separate label in the figures). For convenience in later description, the second interconnect first posts 228 and the second interconnect second posts 230 will be collectively referenced as "second interconnect posts 228/230" (not appearing as a separate label in the figures).

In an aspect, the second interconnect posts 228/230 may be arranged to extend through the dielectric layer 201 at a location proximal, in the first layer 100, to the first level first spiral winding start 102S and the first level second spiral winding start 104S and, in the second layer 202, to the second level first spiral winding start 204S and the second level second spiral winding start 206S. In an aspect, "proximal" may be as described in reference to the first bridged-post inter-layer interconnect 208.

The second bridged-post inter-layer interconnect 226 may include, in the first level 100, a second interconnect first level second post bridge 232 and a second interconnect first level second post stub 234. The second interconnect first level second post bridge 232 may be configured to couple lower ends (visible, but not separately labeled) of the second interconnect second posts 230 together. The second interconnect first level second post bridge 232 and the second interconnect first level second post stub 234 can serve, in combination, as a second interconnect first level second post coupler, which may couple lower ends (visible in FIGS. 1 and 2) of the second interconnect second posts 230 together and to the first level second spiral winding start 104S.

The second bridged-post inter-layer interconnect 226 may include, also in the first layer 100, a second interconnect first level first post stub 236. The second interconnect first level first post stub 236 can serve as a second interconnect first level first post coupler, that may couple the first level second spiral winding start 104S to at least one of the second interconnect first posts 228, for example the second interconnect first post 228B.

The second bridged-post inter-layer interconnect 226 may include, in the second layer 202, a second interconnect second level first post bridge 238 and a second interconnect second level first post stub 240. The second interconnect second level first post bridge 238 may be configured to couple upper ends (visible, but not separately labeled) of the second interconnect first posts 228 together. The second interconnect second level first post bridge 238 and the second interconnect second level first post stub 240 can serve, in combination, as a second interconnect second level first post coupler, which may couple upper ends (visible in FIGS. 1 and 2) of the second interconnect first posts 228 together and to the second level second spiral winding start 206S. The second bridged-post inter-layer interconnect 226 may include, also in the second layer 202, a second interconnect second level second post stub 242. The second interconnect second level second post stub 242 can serve as a second interconnect second level second post coupler, that may couple the second level first spiral winding start 204S to at least one of the second interconnect second posts 230, for example the second interconnect second post 230A.

Referring to FIGS. 1 and 3, the above-described second bridged-post inter-layer interconnect 226 having, for example, the second interconnect first posts 228 coupled by the second interconnect second level first post bridge 238, and the second interconnect second posts 230 coupled by the second interconnect first level second post bridge 232 can provide another low inductance, low resistance coupling between the first level spiral capacitor 102/104 and the second level spiral capacitor 204/206.

FIG. 2 two-layer MLI capacitor 200 can be implemented with the first level first spiral winding 102, the first level second spiral winding 104, the second level first spiral winding 204 and the second level second spiral winding 206 each having a circular spiral form, as is visible in FIGS. 1 and 3. The circular spiral form is intended only as an example. In an aspect, the first level first spiral winding 102 may be formed as a first level first rectangular spiral winding (not specifically visible in the figures), the first level second spiral winding 104 as a first level second rectangular spiral winding (not specifically visible in the figures), the second level first spiral winding 204 as a second level first rectangular spiral winding (not specifically visible in the figures), and the second level second spiral winding 206 as a second level second rectangular spiral winding (not specifically visible in the figures).

FIG. 4 shows a side cut-view, from the FIG. 1 and FIG. 3 cut plane 3-3, with an expanded region "A" diagrammed with simulated electric field lines corresponding to a simulated applied voltage (not explicitly visible in FIG. 4) on the first level first spiral winding 102 and second level second spiral winding 206, with respect to the first level second spiral winding 104 and the second level first spiral winding 204. Referring to FIG. 4, assuming the described simulated applied voltage, electric field PL1 may be established between facing sidewalls (visible, but not separately numbered) of the first level first spiral winding 102 and the first level second spiral winding 104. Associated with the electric field PL1 may be a capacitance approximately proportional to the total area of the described facing sidewalls. This capacitance can be approximated as a planar capacitance. Persons of ordinary skill in the art, upon reading this disclosure, can readily determine the total area of the facing sidewalls, and the constant of proportionality for calculating the capacitance, in an application-specific manner. Therefore, further detailed description of such calculations is omitted. For purposes of description, the planar capacitance formed by the first level first spiral winding 102 and the first level second spiral winding 104 can be termed "C(PL1)", which may be in units of Farads.

Similarly, in an aspect, the respective sidewalls of the second level first spiral winding 204 and the second level second spiral winding 206 can establish electric fields "PL." Associated with the electric fields PL can be another capacitance, which will be termed be termed "C(PL)", which may be in units of Farads. C(PL1), like C(PL2), may be approximated as a planar capacitance.

Continuing to refer to FIG. 4, the above-described applied voltage can establish electric field PC through the dielectric layer 201, between the second level first spiral winding 204 and the first level first spiral winding 102, and between the second level second spiral winding 206 and the first level second spiral winding 104. Associated with the electric field PC may be a capacitance approximately proportional to the total mutually facing area of the second level first spiral winding 204 and the first level first spiral winding 102, added to the total mutually facing area of the second level second spiral winding 206 and the first level second spiral winding 104. This capacitance can be approximated as a parallel plate capacitance. Persons of ordinary skill in the art, upon reading this disclosure, can readily determine the described total area of the facing surfaces, and the constant of proportionality for calculating the parallel plate capacitance, in various specific applications. Therefore, further detailed description of such calculations is omitted. For purposes of description, the parallel plate capacitance associated with the field PC can be termed "C(PC)", which may be in units of Farads.

FIG. 5A shows a perspective view of one rotation of a bridged-post inter-layer interconnector 500. The bridged-post inter-layer interconnector 500 can be one example implementation of the first bridged-post inter-layer interconnect 208. FIG. 5B show a perspective view of another rotation of the bridged-post inter-layer interconnector 500.

Referring to FIGS. 5A-5B, the bridged-post inter-layer interconnector 500 may include a first inter-layer post 502A and another first inter-layer post 502B, collectively referred to as "first inter-layer posts" 502 (a label not explicitly appearing on FIG. 5). The bridged-post inter-layer interconnector 500 may also include a second inter-layer post 504A and another second inter-layer post 504B, collectively referred to as "second inter-layer posts" 504 (a label not explicitly appearing on FIG. 5). In an aspect, the first inter-layer posts 502 and the second inter-layer posts 504 may be arranged along a linear axis, such as the example labeled AX. The first inter-layer posts 502 and the second inter-layer posts and may be spaced apart by a pitch P2. The first inter-layer posts 502 and the second inter-layer posts 504 may be formed, for example, as metal vias (not separately visible in FIGS. 5A-5B) through a dielectric substrate (e.g., the dielectric layer 201 of FIG. 2). In a further aspect the first inter-layer posts 502 and the second inter-layer posts 504 may have a height H1, for example, corresponding to a thickness of a dielectric layer. Remaining structures of the bridged-post inter-layer interconnector 500, described in further detail below, may be formed of a metal according to known, conventional metallization techniques.

Continuing to refer to FIGS. 5A-5B, in an aspect, a first post lower bridge 506 may bridge the bottoms (visible in FIG. 5A, but not separately numbered) of the first inter-layer posts 502 together. In an associated aspect, a second post upper bridge 508 may bridge the tops (visible in FIG. 5A, but not separately numbered) of the second inter-layer posts 504 together. In an aspect, a first post lower straight stub 510 can extend, for example, perpendicular to the linear axis AX, from the bottom of one of first interlayer posts, for example, the first inter-layer post 502A. The first post lower straight stub 510 can extend a distance D4. A second post lower angled stub 512 can extend a length (visible, bit not separately labeled), in an "AZ" direction from the bottom of one of the second inter-layer posts 504, for example, the second inter-layer post 504B. The AZ direction is angled with respect to the direction of the first post lower straight stub 510. The length of the second post lower angled stub 512 and the angle of the AZ direction can be set to obtain a desired spacing P3 between the distal ends (visible in FIG. 5A, but not separately numbered) of the first post lower straight stub 510 and the second post lower angled stub 512. For example, referring to FIGS. 1 and 5A, the spacing P3 may be set to correspond to the pitch distance P1 between the first level first spiral winding 102 and the first level second spiral winding 104.

Referring to FIGS. 5A-5B, in an aspect, a first post upper straight stub 514 can extend, for example, perpendicular to the linear axis AX and parallel to the first post lower straight stub 510, from the top of one of first interlayer posts, for example, the first inter-layer post 502B. A second post upper angled stub 516 can extend a length (visible, bit not separately labeled), parallel to the "AZ" direction from the top of one of the second inter-layer posts 504, for example, the top of the second inter-layer post 502D. In an aspect, the respective lengths of the first post upper straight stub 514 and the second post upper angled stub 516 can be as described hereinabove with respect the first post lower straight stub 510 and the second post lower angled stub 512. This will obtain the same spacing (not labeled but equal to P3) between the distal ends (visible in FIG. 5B, but not separately numbered) of the first post upper straight stub 514 and the second post upper angled stub 516.

Figure 7:
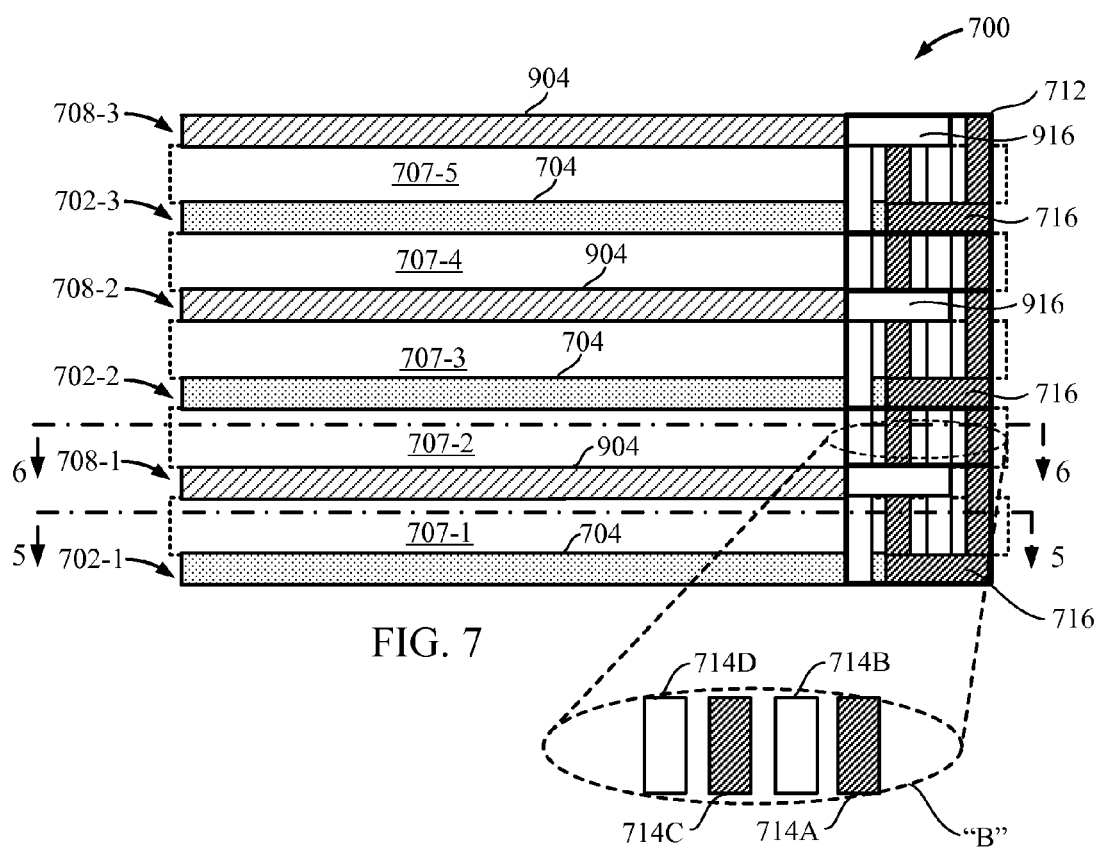
FIG. 7 shows a front projection of another multi-layer interconnected capacitor according to various aspects.

Referring to FIGS. 1-3 and 5A-5B, the bridged-post inter-layer interconnector 500 can be one implementation of the bridged-post inter-layer interconnect 208. As illustrated, the first post lower bridge 506 can implement the first level first post bridge 106, and the second post upper bridge 508 can implement the second level second post bridge 220. A minor modification of the bridged-post inter-layer interconnector 500 can also be one implementation of the second bridged-post inter-layer interconnect 226. One example is shown in FIG. 6. To avoid unnecessary repetition of description, like structure between FIGS. 5A, 5B and 6 is not labeled. The FIG. 6 alternative bridged-post inter-layer interconnector 600 can comprise a first post upper bridge 602, which bridges the respective tops of the first inter-layer posts 502 together, and a second post lower bridge 604, which bridges the respective bottoms of the second inter-layer posts 504 together, FIG. 7 shows a front projection of a MLI capacitor 700 according to one or more aspects. The MLI capacitor 700 may include an alternating order stacking of "odd" level spiral capacitors, 702-1, 702-2 and 702-3, which can be according to the FIG. 1 first level spiral capacitor 102/104, and "even" level spiral capacitors 708-1, 702-2 and 702-3, which can be according to the FIG. 2 second level spiral capacitor 204/206. For convenience in later description, the odd level spiral capacitors 702-1, 702-2 and 702-3 can be referenced collectively as "odd level spiral capacitors 702" (a label that does not appear separately in the figures). Likewise, the even level spiral capacitors 708-1, 708-2 and 708-3 can be referenced collectively as "even level spiral capacitors 708" (a label that does not appear separately in the figures). It will be understood that the correspondence of "even" and "odd", i.e., which among the FIG. 1 first level spiral capacitor 102/104 and FIG. 2 second level spiral capacitor 204/206 is used for the odd level spiral capacitors 702 and which is used for the even level spiral capacitor 708, is arbitrary.

It will be understood that the "odd" and "even" naming scheme is only for purposes of describing example operations and implementations. For example, an alternative naming scheme can be used, in which the odd level spiral capacitor 702-1 can be alternatively referenced as the "first level spiral capacitor" 702-1, the even level spiral capacitor 708-1 can be alternatively referenced as the "second level spiral capacitor" 708-1, and the odd level spiral capacitor 702-2 can be alternatively referenced as a "third level spiral capacitor" 702-3. Similarly, the even level spiral capacitor 708-2 can be alternatively referenced as the "fourth level spiral capacitor" 708-2, the odd level spiral capacitor 702-3 can be alternatively referenced as a "fifth level spiral capacitor" 702-3, and the odd level spiral capacitor 708-3 can be alternatively referenced as the "sixth level spiral capacitor" 708-3.

Figure 8:
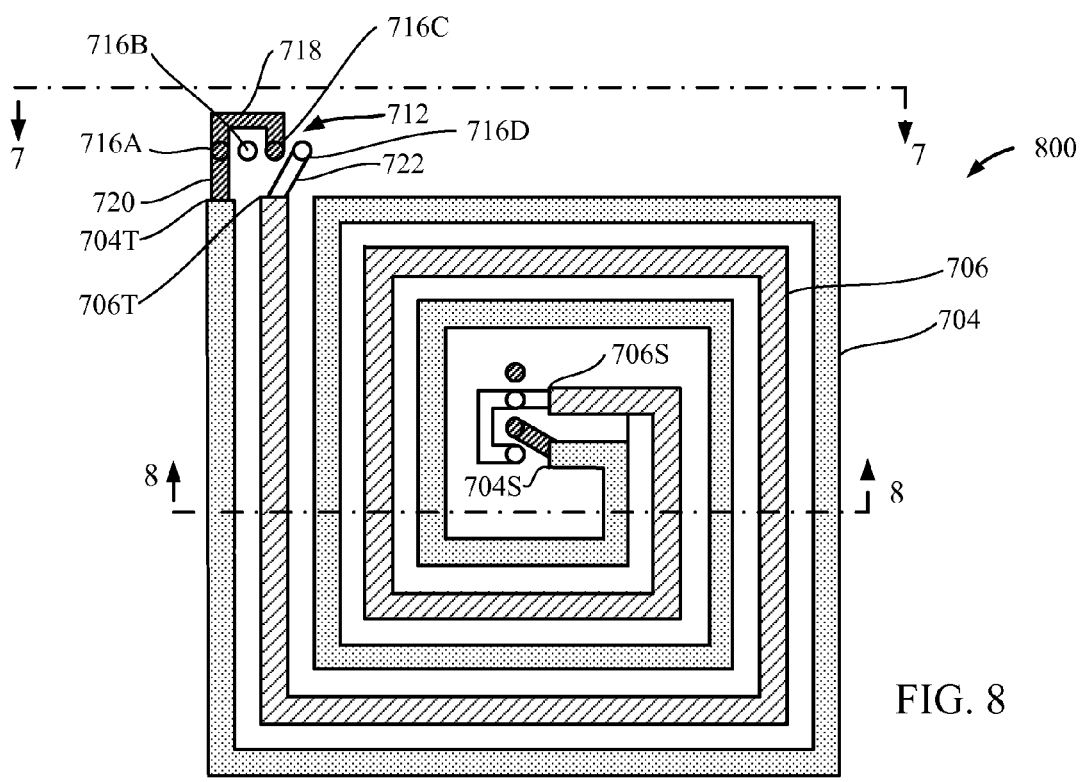
FIG. 8 shows a plan view of an odd layer of the FIG. 7 multi-layer interconnected capacitor, seen from the FIG. 7 projection plane 5-5, with a stacking dielectric rendered transparent.
Figure 9:
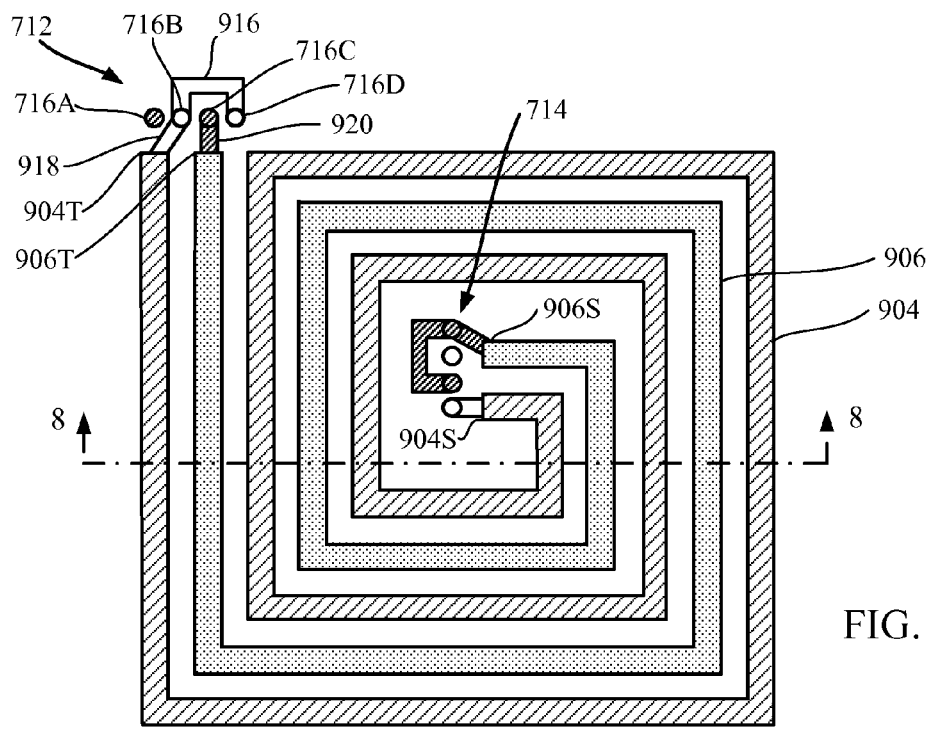
FIG. 9 shows a plan view of an even layer of the FIG. 7 multi-layer interconnected capacitor, seen from the FIG. 7 projection plane 6-6.

FIG. 8 shows a plan view of one example configuration 800, for the odd level spiral capacitors 702, viewed from the FIG. 7 projection plane 5-5 above the first level spiral capacitor 702-1. FIG. 9 shows a plan view of one example configuration 900 for the even level spiral capacitors 708-1, 708-2 and 708-3, viewed from the FIG. 7 projection plane 6-6 above the first level spiral capacitor 708-1. Referring to FIG. 7, the stacking configuration can include a dielectric layer, interspersed between each of the odd level spiral capacitors 702 and its overlying even level spiral capacitor 708. Referring to FIG. 7, examples are the first dielectric layer 707-1, the second dielectric layer 707-2, the third dielectric layer 707-3, the fourth dielectric layer 707-4 and the fifth dielectric layer 707-5, collectively referred to as "stacking dielectric layers 707" (a label not separately appearing in the figures).

Referring to the FIG. 8 configuration 800, the first level spiral capacitor 702-1 (and all other odd level spiral capacitors 702) may comprise a first level first spiral winding 704 arranged in parallel with a first level second spiral winding 706 (visible in FIG. 8, obstructed from view in FIG. 7). As described hereinabove, the first level first spiral winding 704 may be configured as the FIG. 1 first level first spiral winding 102, and the first level second spiral winding 706 may be configured as the FIG. 1 first level second spiral winding 104. The first level first spiral winding 704, since it may be included in each of the odd level spiral capacitors 702, will be referred to alternatively as an "odd level first spiral winding" 704. Similarly, the first level second spiral winding, since it may be included in each of the odd level spiral capacitors 702, will be referred to alternatively as an "odd level second spiral winding" 706.

With continuing reference to FIGS. 7 and 8, the odd level first spiral winding 704 of each of the odd level spiral capacitors 702 can extend from an odd level first spiral winding start 704S to an odd level first spiral winding termination 704T. Similarly, the odd level second spiral winding 706 of each of the odd level spiral capacitors 702 can extend from an odd level second spiral winding start 706S to an odd level second spiral winding termination 706T.

Referring to FIGS. 7 and 9, in an aspect, stacked on an upper surface (visible in cross-section but not separately numbered) of the first level spiral capacitor 702-1 may be the first dielectric layer 707-1 and, on the first dielectric layer 707-1, the second level spiral capacitor 708-1. The second level spiral capacitor 708-1 can comprise a second level first spiral winding 904 (visible in FIGS. 7 and 9) arranged in parallel with a second level second spiral winding 906 (visible in FIG. 9). The second level first spiral winding 904, since it may be included in each of the even level spiral capacitors 708, will be referred to alternatively as an "even level first spiral winding" 904. Similarly, the second level second spiral winding, since it may be included in each of the even level spiral capacitors 708, will be referred to alternatively as an even level second spiral winding" 906. In an aspect, the even level first spiral winding 904 of each of the even level spiral capacitors 708 can extend from an even level first spiral winding start 904S to an even level first spiral winding termination 904T. Similarly, the even level second spiral winding 906 of each of the even level spiral capacitors 902 can extend from an even level second spiral winding start 906S to an even level second spiral winding termination 906T.

With continuing reference to FIGS. 7 and 9, in an aspect, the second level first spiral winding 904 may be in a tracking alignment (not explicitly visible in FIG. 7) with the first level first spiral winding 704 of the underlying first spiral capacitor 702-1. Similarly, the second level second spiral winding 906 may be in a tracking alignment with the first level second spiral winding 706 of the underlying first spiral capacitor 702-1. These tracking alignments, in an aspect, can provide two parallel plate capacitors, approximately equal to the parallel plate capacitances provided by the FIG. 2 two-layer MLI capacitor 200.

It will be understood, in a more general sense, that one or more example MLI capacitors according to various aspects may be configured as a stack of odd level spiral capacitors (e.g., the FIG. 7 odd level spiral capacitors 702) and a plurality of even level spiral capacitors (e.g., the FIG. 7 even level spiral capacitors 708), stacked in an alternating order and spaced apart by respective dielectric layers (e.g., the FIG. 7 stacking dielectric layers 705). In an aspect, in one or more example MLI capacitors, each of the odd level spiral capacitors can comprise an odd level first spiral winding (e.g., the FIG. 8 odd level first spiral conductor 704) and an odd level second spiral winding (e.g., the FIG. 8 odd level second spiral winding 706). In a similar general sense, each of the even level spiral capacitors can comprise an even level first spiral winding (e.g., the FIG. 9 even level first spiral winding 904) and an even level second spiral (e.g., the FIG. 9 even level second spiral winding 906). In an aspect, in one or more example MLIs, the even level first spiral winding can be above and in a tracking alignment with the odd level first spiral winding of an underlying one of the odd level spiral capacitors. Similarly, the even level second spiral winding can be above and in a tracking alignment with the odd level second spiral winding of an underlying one of the odd level spiral capacitors.

Referring to FIGS. 7-9, in an aspect, the MLI capacitor 700 can include a first bridged-post inter-layer interconnector 712 and a second bridged-post inter-layer interconnector 714 (not visible in FIG. 7, visible in cross section in FIGS. 8 and 9). As will be described in further detail in reference to FIGS. 11A and 11B and elsewhere, in an aspect, the first bridged-post inter-layer interconnector 712 may be formed as a stacking of three duplicates of the bridged-post inter-layer interconnector 500 described in reference to FIGS. 5A-5B. For brevity, only the first bridged-post inter-layer interconnector 712 will be described in detail. It will be understood that the second bridged-post inter-layer interconnector 714 may comprise at least two second interconnect first posts (visible in FIGS. 8 and 9 but not separately labeled) and at least two second interconnect second posts (visible in FIG. 9 but not separately labeled). Upon reading this description, it will be understood that the second bridged-post inter-layer interconnector 714 may be formed as a stacking of three duplicates of the alternative bridged-post inter-layer interconnector 600 described in reference to FIGS. 6A-6B.

Referring to FIG. 7, the first bridged-post inter-layer interconnector 712 may include posts 716A-716D that can extend in a stacking direction SD, adjacent and proximal to the odd level first spiral winding termination 704T, and proximal to the odd level second spiral winding termination 706T of all of the odd level spiral capacitors 702, and proximal to the even level first spiral winding termination 904T and the even level second spiral winding termination 906T of all even level spiral capacitors 708. As described in further detail in later sections, in an aspect, the first bridged-post inter-layer interconnector 712 may be configured as a stacking of duplicates of the bridged-post inter-layer interconnect 208 described in reference to FIGS. 1-3.

According to an aspect, post 716A and post 716C of the first bridged-post inter-layer interconnector 712 can be bridged together adjacent each of the odd level spiral capacitors 702 by a first level first post bridge 718. The first level first post bridge 718, since an instance may be included adjacent each of the odd level spiral capacitors 702, will be referred to alternatively as an "odd level first post bridge" 718. The post 716A and post 716C are therefore referred to collectively as "first posts 716A/716C" (a label not separately appearing in the figures). The post 716B and post 716D, for purposes of later description, can be referred to collectively as "second posts 716B/716D" (a label not separately appearing in the figures). In addition, adjacent each of the odd level spiral capacitors 702, a first level first post stub 720 can couple at least one of the first posts 716A/716C, e.g., post 716A, to the first level first spiral winding 704. The first level first post stub 720, since an instance may be included adjacent each of the odd level spiral capacitors 702, will be referred to alternatively as an "odd level first post stub" 720. In a similar aspect, adjacent each of the odd level spiral capacitors 702 a first level second post stub 722 can couple at least one of the second posts 716B/716D, e.g., post 716D, to the first level second spiral winding 706 in that layer. The first level second post stub 722, since an instance may be included adjacent each of the odd level spiral capacitors 702, will be referred to alternatively as an "odd level second post stub" 722.

Referring to FIGS. 7 and 9, according to an aspect, the second posts 716B/716D of the first bridged-post inter-layer interconnector 712 can be bridged together adjacent each of the even level spiral capacitors 708 by a first level first bridge 916. In addition, adjacent each of the even level spiral capacitors 708 a second level second post stub 918 can couple at least one of the second posts 716B/716D, e.g., post 716B, to the second level first spiral winding 904 in that layer, and a second level first post stub 920 can couple at least one of the first posts 716A/716C, e.g., post 716C, to the second level first spiral winding 904 in that layer.

As will be appreciated by persons of ordinary skill, the above-described structure of the first bridged-post inter-layer interconnector 712 (and like structure of the second bridged-post inter-layer interconnect 714) can provide, among other features, a low resistance, low inductance parallel connection, and therefore efficient exploitation of the planar capacitances provided by each of the spiral capacitors in the stack, and the multiple parallel plate capacitances formed by the tracked alignment of the spiral winding in each of the layers with spiral winding in its overlying layer, or underlying, or both.

Referring to FIGS. 7 and 8, in an aspect, disposed on an upper surface (visible in cross-section but not separately numbered) of the second level spiral capacitor 708-1 may be the second dielectric layer 707-2 and, on the second dielectric layer 707-2, the third level spiral capacitor 702-2. The third level spiral capacitor 702-2 comprises another instance (not visible in the figures) of the odd level first spiral winding 704 arranged in parallel with another instance (not visible in the figures) of the odd level second spiral winding 706. The respective instances in the third level spiral capacitor 702-2 of the odd level first spiral winding 704 and of the odd level second spiral winding 706 will be referred to as the "third level first spiral winding" and the "third level second spiral winding" respectively. The third level first spiral winding may be in a tracking alignment (not explicitly visible in FIG. 7) with the even level first spiral winding 904 of the second spiral capacitor 708-1. Similarly, the third level second spiral winding may be in a tracking alignment with the second level second spiral winding 906. These tracking alignments, in an aspect, can provide an additional two parallel plate capacitors, approximately equal to the parallel plate capacitances provided by the FIG. 2 two-layer MLI capacitor 200.

Referring to FIGS. 7 and 9, in an aspect, stacked on an upper surface (visible in cross-section but not separately numbered) of the third level spiral capacitor 702-2 may be the third dielectric layer 707-3 and, on the third dielectric layer 707-3, the fourth level spiral capacitor 708-2. The fourth level spiral capacitor 708-2 comprises another instance (not explicitly visible in the figures) of the even level first spiral winding 904 arranged in parallel with another instance (not explicitly visible in the figures) of the second level second spiral winding 906. The instance of the even level first spiral winding 904 and the instance of the even level second spiral winding 906 in the fourth level spiral capacitor 708-2 will be referred to as the "fourth level first spiral winding" and "fourth level second spiral winding," respectively. The fourth level first spiral winding may be in a tracking alignment (not explicitly visible in FIG. 7) with the third level first spiral winding of the underlying third spiral capacitor 702-2, and fourth level second spiral winding may be in a tracking alignment with the third level second spiral winding. These tracking alignments, in an aspect, can provide an additional two parallel plate capacitors, approximately equal to the parallel plate capacitances provided by the FIG. 2 two-layer MLI capacitor 200.

Referring to FIGS. 7 and 8, in an aspect, stacked on an upper surface (visible in cross-section but not separately numbered) of the fourth level spiral capacitor 708-2 may be the fourth dielectric layer 707-4 and, on the fourth dielectric layer 707-4, the fifth level spiral capacitor 702-3. The fifth level spiral capacitor 702-3 comprises another instance (not explicitly visible in the figures) of the odd level first spiral winding 704 arranged in parallel with another instance (not explicitly visible in the figures) of the odd level second spiral winding 706. The instance of the odd level first spiral winding 704 and of the odd level second spiral winding in the fifth level spiral capacitor will be referred, respectively, as the "fifth level first spiral winding" and "fifth level second spiral winding." The fifth level first spiral winding may be in a tracking alignment (not explicitly visible in the figures) with the fourth level first spiral winding of the underlying fourth spiral capacitor 708-2, and the fifth level second spiral winding may be in a tracking alignment (not explicitly visible in the figures) with the fourth level second spiral winding. These tracking alignments can provide still another additional two parallel plate capacitors, approximately equal to the parallel plate capacitances provided by the FIG. 2 two-layer MLI capacitor 200.

Referring to FIGS. 7 and 9, stacked on an upper surface (visible in cross-section but not separately numbered) of the fifth level spiral capacitor 702-3 may be the fifth dielectric layer 707-5, on which may be stacked the sixth level spiral capacitor 708-3. The sixth level spiral capacitor 708-3 comprises another instance (not explicitly visible in the figures) of the even level first spiral winding 904 arranged in parallel with another instance (not explicitly visible in the figures) of the even level second spiral winding 906. The instance of the even level first spiral winding 904 and of the even level second spiral winding 906 in the sixth level spiral capacitor 708-3 will be referred, respectively, as the "sixth level first spiral winding" and "sixth level second spiral winding." The sixth level first spiral winding may be in a tracking alignment with the fifth level first spiral winding of the underlying fifth spiral capacitor 702-3, and the sixth level second spiral winding may be in a tracking alignment with the fifth level second spiral winding. These tracking alignments can provide still another additional two parallel plate capacitors, approximately equal to the parallel plate capacitances provided by the FIG. 2 two-layer MLI capacitor 200.

Figure 10:
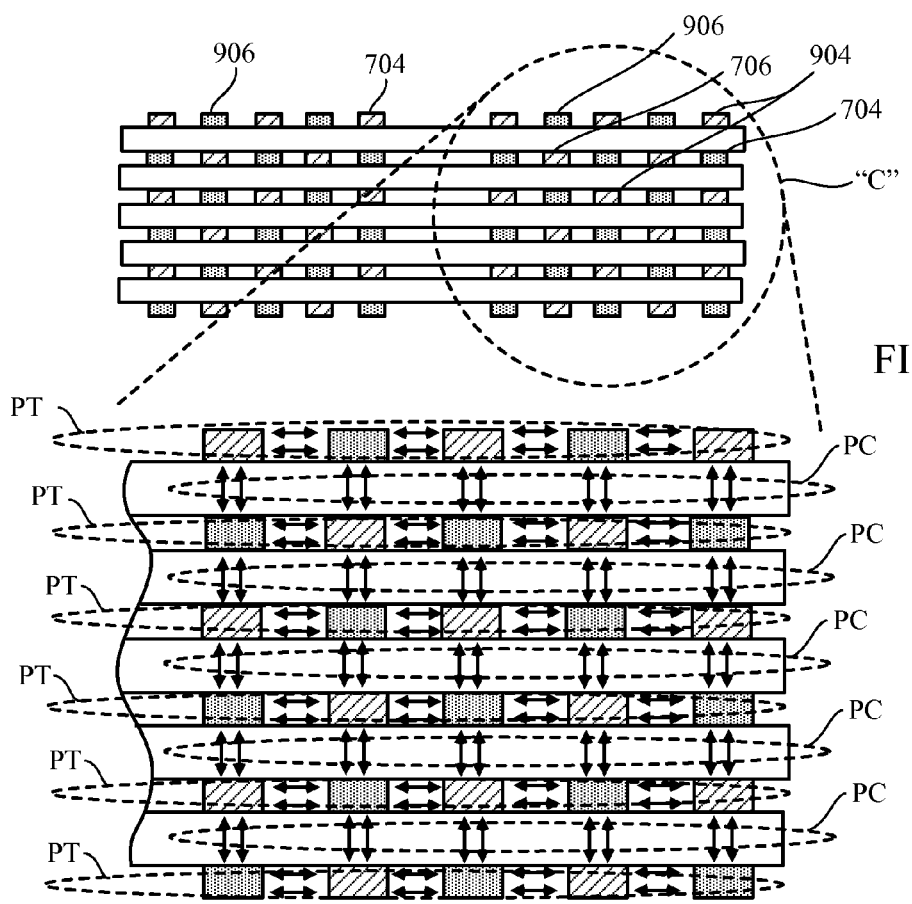
FIG. 10 shows a side cut-view, from the FIG. 8 and FIG. 9 cut plane 8-8, with an expanded region "C" diagrammed with simulated electric field lines corresponding to a simulated applied voltage.

FIG. 10 shows a side cut-view, from the FIG. 8 and FIG. 9 cut plane 8-8, with an expanded region "C" diagrammed with simulated electric field lines corresponding to a simulated applied voltage (not explicitly visible in FIG. 10) on the odd level first spiral winding 704 of all of the odd level spiral capacitors 702 and on the even level second spiral winding 906 of all of the even level spiral capacitors 708, with respect to a voltage on the odd level second spiral winding 706 of all of the odd level spiral capacitors 702 and on the even level first spiral winding 904 of all of the even level spiral capacitors 708.

Referring to FIG. 10, assuming the described simulated applied voltage, electric field PT may be established between facing sidewalls (visible, but not separately numbered) of the odd level first spiral winding 704 and odd level second spiral winding 706 in each of the odd level spiral capacitor 702. The electric field PT may likewise established between facing sidewalls (visible, but not separately numbered) of the even level first spiral winding 904 and even level second spiral winding 906 in each of the even level spiral capacitors 708. The electric field PT may correspond, in part, to a capacitance approximately proportional to the total area of the facing sidewalls of the odd level first spiral winding 704 and the odd level second spiral winding 706, and of the facing sidewalls of the even level first spiral winding 904 and the even level second spiral winding 906. This capacitance can be approximated as a planar capacitance, which may be expressed in units of Farads. Persons of ordinary skill in the art, upon reading this disclosure, can readily determine the total area of the facing sidewalls, and the constant of proportionality for calculating the capacitance in various specific applications. Therefore, further detailed description of such calculations is omitted.

Continuing to refer to FIG. 10, the above-described applied voltage can establish electric field PC through each of the stacking dielectric layers 707. Associated with the electric field PC may be a parallel plate capacitance, for example, in units of Farads. Persons of ordinary skill in the art, upon reading this disclosure, can readily determine the described total area of the facing surfaces, and the constant of proportionality for calculating the parallel plate capacitance. Further detailed description of such calculations is therefore omitted.

Figure 11A:
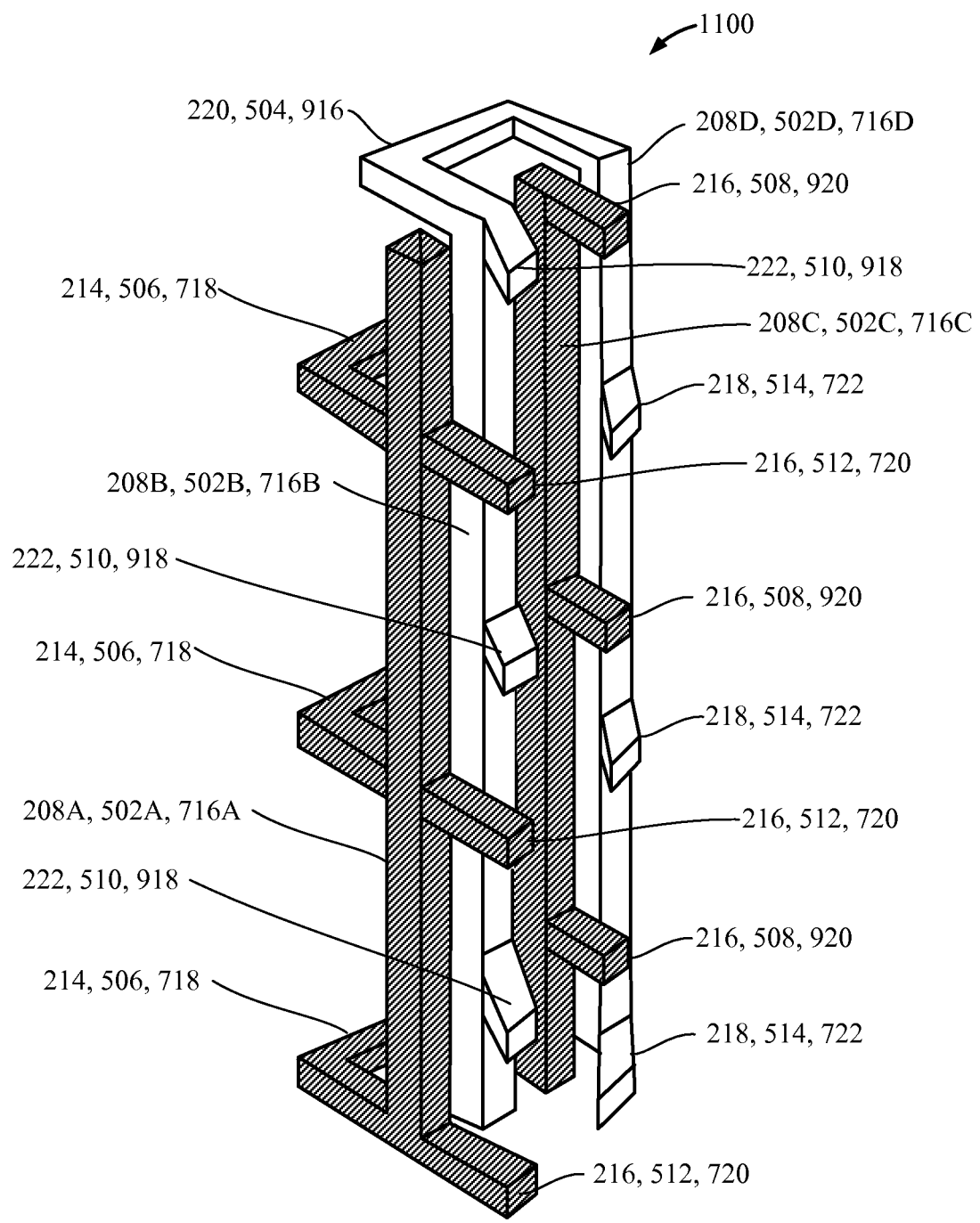
FIG. 11A shows a perspective view of one rotation of one bridged inter-layer stack interconnect forming a stacked combination of interlayer interconnects and inter-capacitor interconnects in the FIG. 7 multi-layer interconnected capacitor according to various aspects

FIG. 11A shows a perspective view of one rotation of the first bridged-post inter-layer interconnector 712 described in reference to FIGS. 7-9. As previously described, the first bridged-post inter-layer interconnector 712 can, in an aspect, be configured as a stacking of the bridged-post inter-layer interconnect 208 described in reference to FIGS. 1-3, or as a stacking of the bridged-post inter-layer interconnector 500 described in reference to FIGS. 5A-5B. To illustrate examples of such stacking, FIG. 11A additionally labels the first bridged-post inter-layer interconnector 712 structures with the labels used in FIGS. 7-9, and with labels used in describing the bridged-post inter-layer interconnect 208 and the bridged-post inter-layer interconnector 500.

Figure 11B:
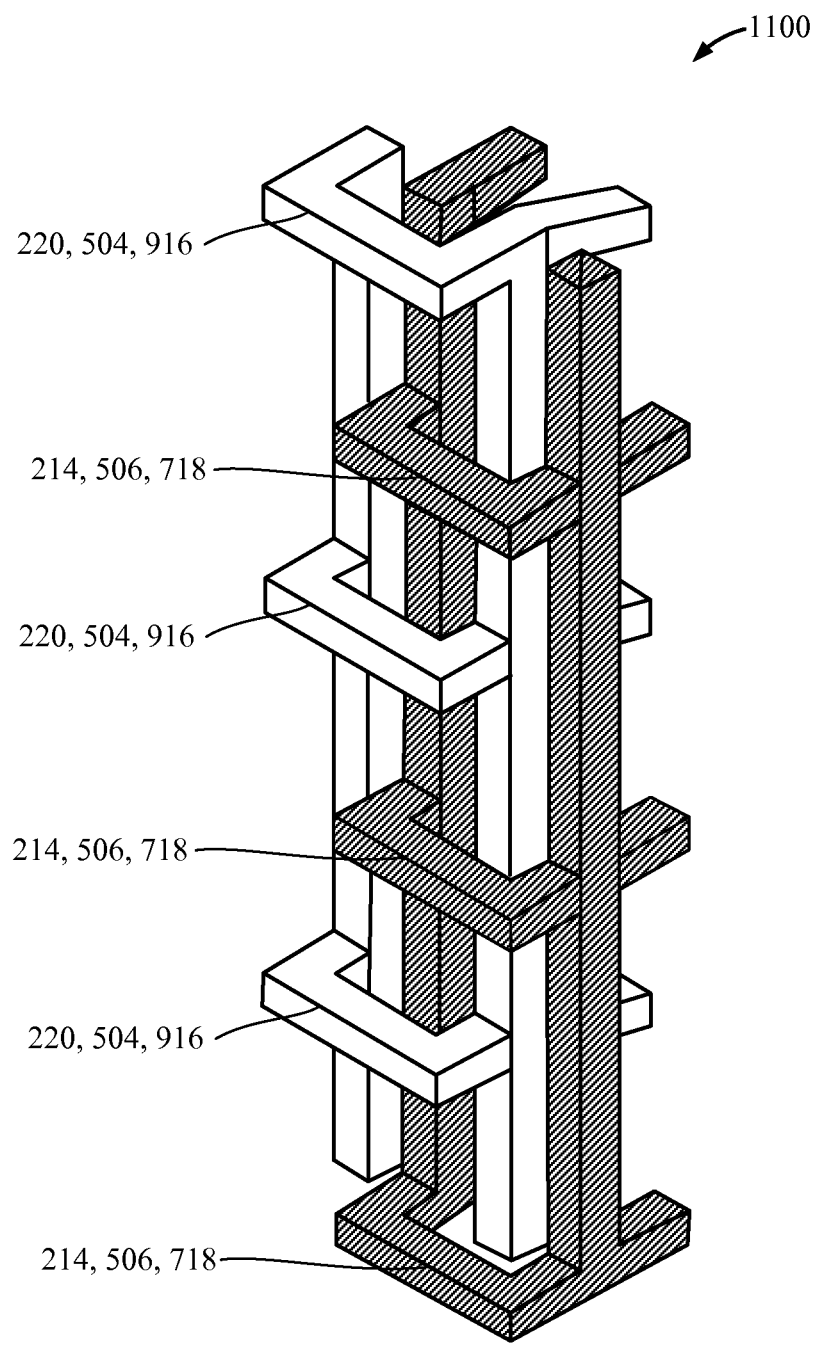
FIG. 11B shows a perspective view of another rotation of the bridged-post inter-layer stack interconnect of FIG. 11A.

FIG. 11B shows a perspective view of another rotation of the first bridged-post inter-layer interconnector 712.

Referring to FIGS. 7, 8 and 11A, the lower-most instance on FIG. 11A of the first level first post bridge 718 and the first level first post stub 720 can serve, in combination, as a first level first post coupler (not separately labeled) in the first level spiral capacitor 702-1. The first level first post coupler may couple lower ends (visible in FIG. 8) of the first posts 716A/716C together and to the first level first spiral winding termination 704T. Continuing to refer to FIGS. 7, 8 and 11A, the next instance, moving upward on the FIG. 11A view, of the first level first post bridge 718 and the first level first post stub 720 can serve, in combination, as a third level first post coupler (not separately labeled) in the third level spiral capacitor 702-2. The third level first post coupler may couple the first posts 716A/716C together and to the odd level first spiral winding termination 704T in the third level spiral capacitor 702-2.

Referring to FIGS. 7, 8 and 11A, the lower-most instance on FIG. 11A of the first level second post stub 722 can serve as a first level second post coupler (not separately labeled) in the first level spiral capacitor 702-1. The first level second post coupler can couple at least one of the second posts 716B/716D, e.g., post 716D, to the odd level second spiral winding termination 706T in the first level spiral capacitor 702-1. Continuing to refer to FIGS. 7, 8 and 11A, the next instance, moving upward on the FIG. 11A view, of the first level second post stub 722 can serve as a third level second post coupler (not separately labeled) in the third level spiral capacitor 702-2. The third level second post coupler can couple at least one of the second posts 716B/716D, e.g., post 716D, to the odd level second spiral winding termination 706T in the third level spiral capacitor 702-2.

Referring to FIGS. 7, 9, 11A and 11B, the lower-most instance on FIG. 11A of the second level second post bridge 916 and the second level second post stub 918 can serve, in combination, as a second level second post coupler (not separately labeled) in the second level spiral capacitor 708-1. The second level second post coupler may couple (visible in FIG. 9) the second posts 716B/716D together and to the second (or even) level first spiral winding termination 904T. Continuing to refer to FIGS. 7, 9 and 11A-11B, the next instance, moving upward on the FIG. 11A-11B views, of the second level second post bridge 916 and the second level second post stub 918 can serve, in combination, as a fourth level second post coupler (not separately labeled) in the fourth level spiral capacitor 708-2. The fourth level second post coupler may couple the second posts 716B/716D together and to the second (or even) level first spiral winding termination 904T in the fourth level spiral capacitor 708-2.

As previously described, in aspects of the FIG. 7 MLI capacitor 700, the first level spiral capacitor 702-1, third level spiral capacitor 702-2 and fifth level spiral capacitor 702-3 can be referred to as "odd level spiral capacitors" 702. In an aspect, instances (not visible in FIG. 7) of the first level first post bridge 718 and the first level first post stub 720 disposed in the odd level spiral capacitors 702 can be referred to as "odd level first post couplers" (not separately labeled in the figures). Similarly, instances (not visible in FIG. 7) of the first level second post stub 722 disposed in the odd level spiral capacitors 702 can be referred to as "odd level second post couplers" (not separately labeled in the figures).

Continuing to refer to FIGS. 7, 9, 11A and 11B, the lower-most instance on FIG. 11A of the second level first post stub 920 can serve as a second level first post coupler (not separately labeled) in the second level spiral capacitor 708-1. The second level first post coupler may couple (visible in FIG. 9) at least one of the first posts 716A/716C, e.g., first post 716C, to the second (or even) level second spiral winding termination 906T. Continuing to refer to FIGS. 7, 9 and 11A-11B, the next instance, moving upward on the FIG. 11A-11B views, of the second level first post stub 920 can serve as a fourth level first post coupler (not separately labeled) in the fourth level spiral capacitor 708-2. The fourth level first post coupler may couple (visible in FIG. 9) at least one of the first posts 716A/716C, e.g., first post 716C, to the fourth (or even) level second spiral winding termination 906T in the fourth level spiral capacitor 708-2.

As previously described, in aspects of the FIG. 7 MLI capacitor 700, the second level spiral capacitor 708-1, fourth level spiral capacitor 708-2 and sixth level spiral capacitor 708-3 can be referred to as "even level spiral capacitors" 708. In an aspect, instances (not visible in FIG. 7) of the second level second post bridge 916 and the second level second post stub 918 disposed in the even level spiral capacitors 708 can be referred to as "even level second post couplers" (not separately labeled in the figures). Similarly, instances (not visible in FIG. 7) of the second level first post stub 920 disposed in the even level spiral capacitors 708 can be referred to as "even level first post couplers" (not separately labeled in the figures).

Referring to FIGS. 7, 8 and 9, in structures such as the MLI capacitor 700 there can be a second bridged-post inter-layer interconnector that such as the second bridged-post inter-layer interconnector 714 (not visible in FIG. 7, visible in cross section in FIGS. 8 and 9). It will be appreciated by persons of ordinary skill that the second bridged-post inter-layer interconnector 714 may be implemented as a modification of the FIG. 11A-11B structure of first bridged-post inter-layer interconnector 712.

For example, referring to FIGS. 1, 2, 7, 8 and 11A-11B, the structure of FIGS. 11A-11B can be readily modified to provide, in each of the odd level spiral capacitors 702, an instance of the FIG. 2 second interconnect first level second post bridge 232 and of the second interconnect first level second post stub 234. The instances of the second interconnect first level second post bridge 232 and second interconnect first level second post stub 234 may serve, in combination, as a second interconnect odd level second post coupler (not separately labeled). The second interconnect odd level second post coupler which may couple the second interconnect second posts 230 together and to the first level second spiral winding start 104S.

Continuing to refer to FIGS. 1, 2, 7, 8 and 11A-11B, the structure of FIGS. 11A-11B can be readily modified to provide, in each of the odd level spiral capacitors 702, an instance of the FIG. 2 second interconnect first level first post stub 236. The instances of the second interconnect first level first post stub 236 may serve as a second interconnect odd level first post coupler (not separately labeled). The second interconnect odd level first post coupler may couple one of the second interconnect first posts 228 to the first level first spiral winding start 102S.

Referring to FIGS. 1, 2, 7, 8 and 11A-11B, the structure of FIGS. 11A-11B can be readily modified to provide, in each of the even level spiral capacitors 708, an instance of the FIG. 2 second interconnect second level first post bridge 238 and of the second interconnect second level first post stub 240. The instances of the second interconnect second level first post bridge 238 and second interconnect second level first post stub 240 may serve, in combination, as a second interconnect even level first post coupler (not separately labeled). The second interconnect even level first post coupler may couple the second interconnect first posts 228 together and to the second level second spiral winding start 206S.

Continuing to refer to FIGS. 1, 2, 7, 8 and 11A-11B, the structure of FIGS. 11A-11B can be readily modified to provide, in each of the even level spiral capacitors 708, an instance of the FIG. 2 second interconnect second level second post stub 242. The instances of the second interconnect second level second post stub 242 may serve as a second interconnect even level second post coupler (not separately labeled). The second interconnect even level second post coupler may couple one of the second interconnect second posts 230 to the second level first spiral winding start 204S.

The second bridged-post inter-layer interconnect 226 may include, also in the first layer 100, a second interconnect first level first post stub 236. The second interconnect first level first post stub 236 can serve as a second interconnect first level first post coupler, that may couple the first level second spiral winding start 104S to at least one of the second interconnect first posts 228, for example the second interconnect first post 228B.

The second bridged-post inter-layer interconnect 226 may include, in the second layer 202, a second interconnect second level first post bridge 238 and a second interconnect second level first post stub 240. The second interconnect second level first post bridge 238 may be configured to couple upper ends (visible, but not separately labeled) of the second interconnect first posts 228 together. The second interconnect second level first post bridge 238 and the second interconnect second level first post stub 240 can serve, in combination, as a second interconnect second level first post coupler, which may couple upper ends (visible in FIGS. 1 and 2) of the second interconnect first posts 228 together and to the second level second spiral winding start 206S. The second bridged-post inter-layer interconnect 226 may include, also in the second layer 202, a second interconnect second level second post stub 242. The second interconnect second level second post stub 242 can serve as a second interconnect second level second post coupler, that may couple the second level first spiral winding start 204S to at least one of the second interconnect second posts 230, for example the second interconnect second post 230A.

FIG. 12A shows a plan view of a portion 1200A of one alternative bridged-post inter-layer interconnect (not visible in its entirety in FIG. 12A) that may substitute for the bridged-post inter-layer interconnect 208 described, for example, in reference to FIGS. 1-3. Referring to FIGS. 1 and 12A, the portion 1200A of the alternative bridged-post inter-layer interconnect visible in FIG. 12A may function as the portion of the bridged-post inter-layer interconnect 208 shown in FIG. 1. FIG. 12B shows a plan view of a portion 1200B of the alternative bridged-post inter-layer interconnect shown in part in FIG. 12A (not visible in its entirety in FIG. 12B) that may function as the portion of the bridged-post inter-layer interconnect 208 shown in FIG. 3.

Referring to FIG. 12A, the portion 1200A of the alternative bridged-post inter-layer may include alternative first posts 1202A, 1202B and alternative second posts 1204A, 1204B. In an aspect, the alternative first posts 1202A, 1202B, and alternative second posts 1204A, 1204B may be spaced apart by approximately the center-to-center pitch (shown as "P1" in FIG. 1) between the first level first spiral winding 102 and the first level second spiral winding 104. In a further aspect, one of the alternative second posts, for example, the alternative second post 1204A, may be approximately centered with an end (either the first level first spiral winding start 102S or the first level first spiral winding termination 102T) of the first level first spiral winding 102. In a related aspect, one of the alternative first posts, for example, the alternative first post 1202B, may be approximately centered with an end (either the first level second spiral winding start 104S or the first level second spiral winding termination 104T) of the first level second spiral winding 104. As will understood, this arrangement can provide symmetric path length for feeding the first level first spiral winding 102 and the first level second spiral winding 104 on or under a bottom surface of a dielectric (e.g., the dielectric layer 201). Similarly, this arrangement can provide symmetric path length for feeding the second level first spiral winding 204 and second level second spiral winding 206 on a bottom surface of that dielectric.

Referring to FIG. 12A, in an aspect, alternative first level first post bridge 1206 can connect the alternative first posts 1202A, 1202B together. In a further aspect, an alternative first level first post stub 1208 can connect one of the alternative first posts 1202A, 1202B, for example, the alternative first post 1202B, to the first level first spiral winding 102. In a related aspect, a first level second post stub 1210 can connect one of the alternative second posts, for example, the alternative second post 1204B, to the first level second spiral winding 104.

Referring to FIG. 12B, in an aspect, alternative second level second post bridge 1212 can connect the alternative second posts 1204A, 1204B together. In a further aspect, a second level second post stub 1214 can connect one of the alternative second posts 1204A, 1204B, for example the alternative second post 1204A, to the second level first spiral winding 204. In an aspect, a second level first post stub 1216 can connect one of the alternative first posts 1202A, 1202B, for example the alternative first post 1202B, to the second level second spiral winding 206.

FIG. 13A shows a plan view of a portion 1300A of one modification of the portion 1200A of the alternative bridged-post inter-layer interconnect shown in FIG. 12A. Referring to FIG. 13A, the portion 1300A removes the alternative first level first post bridge 1206 and employs, instead, a modified alternative first level second post bridge 1302 that can connect the alternative second posts 1204A, 1204B together.

FIG. 13B shows a plan view of a portion 1300B of one modification of the portion 1200B of the alternative bridged-post inter-layer interconnect shown in FIG. 12B. Referring to FIG. 13B, the portion 1300B removes the alternative second level second post bridge 1212 and employs, instead, a modified alternative second level first post bridge 1304 that can connect the alternative first posts 1202A, 1202B together.

FIG. 14A shows a plan view of a portion 1400A that may function as the portion 1200A of the bridged-post interconnect described in reference to FIGS. 12A-12B, or may function as the portion 1300A of the bridged-post interconnect described in reference to FIGS. 13A-13B.

Referring to FIG. 14A, the portion 1400A of the alternative bridged-post inter-layer interconnect may include inner alternative first posts 1402A, 1402B, and outer alternative second posts 1404A, 1404B. In an aspect, the inner alternative first posts 1402A, 1402B and the outer alternative second posts 1404A, 1404B may be spaced apart (meaning center-to-center between adjacent posts) as described for the alternative first posts 1202A, 1202B and alternative second posts 1204A, 1204B.

Referring to FIG. 14A, in an aspect, another alternative first level second post bridge 1406 can connect the outer alternative second posts 1404A, 1404B together. In a further aspect, an alternative first level second post stub 1408 can connect one of the outer alternative second posts 1404A, 1404B, for example, the outer alternative second post 1404A, to the first level first spiral winding 102. In a related aspect, an alternative first level second post stub 1410 can connect one of the inner alternative first posts 1402B, 1402B, example the inner alternative first post 1402B, to the first level second spiral winding 104.

Referring to FIG. 14B, in an aspect, alternative second level first post bridge 1412 can connect the inner alternative first posts 1402A, 14002B together. In a further aspect, an alternative second level first post stub 1414 can connect one of the inner alternative first posts 1402A, 1402B, for example the inner alternative first post 1402B, to the second level first spiral winding 204. In another aspect, an alternative second level second post stub 1416 can connect one of the outer alternative second posts 1404A, 1404B, for example the outer alternative second post 1404B, to the second level second spiral winding 206.

Referring, for example, to FIGS. 1-3, MLIs according to various aspects an outer turn of the stacked spiral windings can form respective outer peripheral edges or regions. For example, an outer turn of the first level first spiral winding 102 (visible but not separately labeled) can form an outer periphery of the first level spiral capacitor 102/104. Likewise, an outer turn of the second level first spiral winding 204 can form an outer periphery of the second level spiral capacitor 204/206. In an aspect, MLIs can further include one more side inter-layer interconnects, and each side inter-layer interconnect can be configured with one or more first side posts to connect outer turns of alternating level spiral capacitors.

Figure 15A:
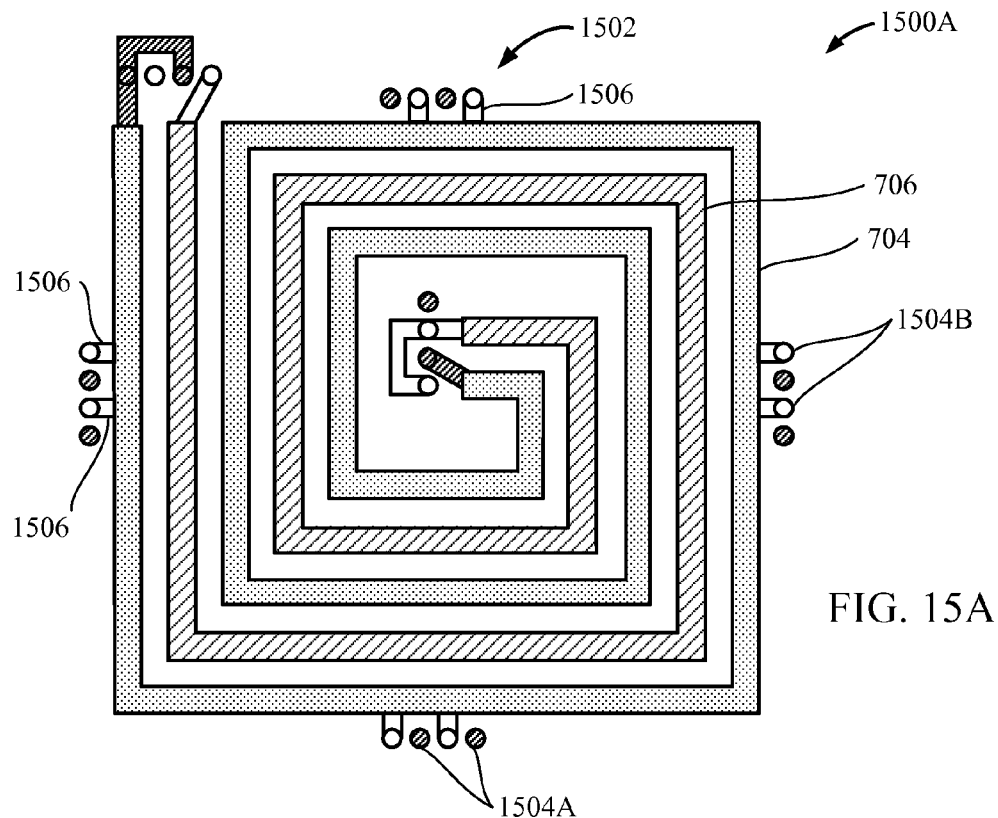
FIG. 15A shows a plan view of one example upper layer of one multi-layer interconnect capacitor with example side interconnects.
Figure 15B:
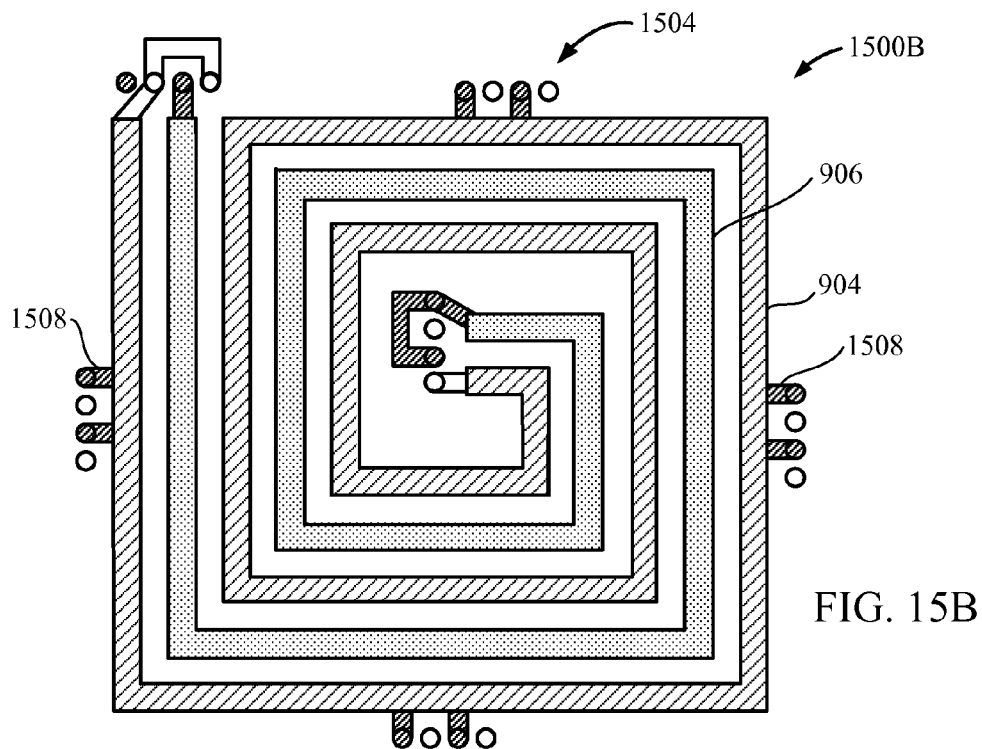
FIG. 15B shows a plan view of one example lower layer of one multi-layer interconnect capacitor with example side interconnects complementary to the FIG. 15A upper layer side interconnects.

FIG. 15A shows a plan view of upper layer 1500A, which is one example of an upper of one MLI capacitor with side inter-layer interconnects 1502, configured and arranged to provide additional interconnection. FIG. 15A shows the side inter-layer interconnects 1502 in relation to each of the odd level spiral capacitors 702 of the FIG. 7 MLI capacitor 700. FIG. 15B shows the side inter-layer interconnects 1502 in relation to each of the even level spiral capacitors 708 of the FIG. 7 MLI capacitor 700. This is to avoid obfuscating the description with details not specific to a particular to the side inter-layer interconnects 1502. FIGS. 15A and 15B show four side interconnects 1502 only for purposes of example. Implementations are contemplated having greater than four side inter-layer interconnects 1502.

Continuing to refer to FIGS. 15A-15B, in an aspect, each of the side inter-layer interconnects 1502 may include one or more or more side first posts 1504A, and a similar quantity of side second posts 1504B. In an aspect, each of the side inter-layer interconnects 1502 may comprise at least two side first posts 1504A and at least two side second posts 1504A. Preferably, the side first posts 1504A and the side second posts 1504B can be located proximal to the outer turns of the odd level spiral capacitors 702 and the outer turns of the even level spiral capacitors 708. The side first posts 1504A and side second posts 1504B may be spaced from the outer turns by a pitch distance. One example pitch distance may be, for example, less than or equal to the pitch distance P1 described in reference to FIG. 1.

In an aspect, odd level side stubs 1506 may couple the side first posts 1504A to the outer turn (visible in FIG. 8 but not separately labeled) of the odd level first spiral winding 704 of the odd level spiral capacitors 702. Referring to FIGS. 7, 8 and 15A, instances (not visible in FIGS. 7 and 8) of the odd level side stubs 1506 may be disposed adjacent the first level spiral capacitor 702-1. Such instances can be referred to as "first level side stubs, and each may be configured and arranged such as the odd level side stubs 1506. Commensurate with the quantity of first side posts 1504A, there may be, for example, at least two first level side stubs. Likewise, instances (not visible in FIGS. 7 and 8) of odd level side stubs 1506 may be disposed adjacent the third level spiral capacitor 702-2. Such instances can be referred to as "third level side stubs." Commensurate with the quantity of first side posts 1504A, there may be, for example, at least two third level side stubs.

In a related aspect, referring to FIGS. 7, 9 and 15B, even level side stubs 1508 may couple the second side posts 1504B to the outer turn (visible in FIG. 9 but not separately labeled) of the even level first spiral winding 904 of the even level spiral capacitors 708. Referring to FIGS. 7, 9 and 15B, instances (not visible in FIGS. 7 and 9) of the even level side stubs 1508 may be disposed adjacent the second level spiral capacitor 708-1. Such instances can be referred to as "second level side stubs, and each may be configured and arranged such as the even level side stubs 1508. Commensurate with the quantity of side second posts 1504B, there may be, for example, at least two second level side stubs. Likewise, instances (not visible in FIGS. 7 and 9) of even level side stubs 1508 may be disposed adjacent the fourth level spiral capacitor 708-2. Such instances can be referred to as "fourth level side stubs." Commensurate with the quantity of second side posts 1504B, there may be, for example, at least two fourth level side stubs.

Referring to FIGS. 15A-15B, in an aspect, a population and geographical distribution of the side inter-layer interconnects 1502 can determine, or control inductance exhibited by the spiral windings. In a related aspect, the population and geographical distribution of the side inter-layer interconnects 1502 may be configured to obtain a desired resonance.

In an aspect, MLI capacitors can also include at least one interior inter-layer interconnect, for similar purposes as the side inter-layer interconnects 1502, but distributed within the spiral windings of the spiral capacitors. For example, interior inter-layer interconnects may be configured to connect interior turns of a first level first spiral winding, e.g., the first level first spiral winding 704 of the FIG. 7 first level spiral capacitor 702-1, to an interior turn of, for example, the third level first spiral winding, e.g., the third level first spiral winding of the third level spiral capacitor 702-2 of the FIG. 7 MLI capacitor 700. Likewise, in an aspect, interior inter-layer interconnects may be configured to connect an interior turn of, for example the second level first spiral winding of the second level spiral capacitor 708-1 of the FIG. 7 MLI capacitor 700 to an interior turn of, for example, the even level first spiral winding of the fourth level spiral capacitor 708-2 of the FIG. 7 MLI capacitor 700.

Figure 16A:
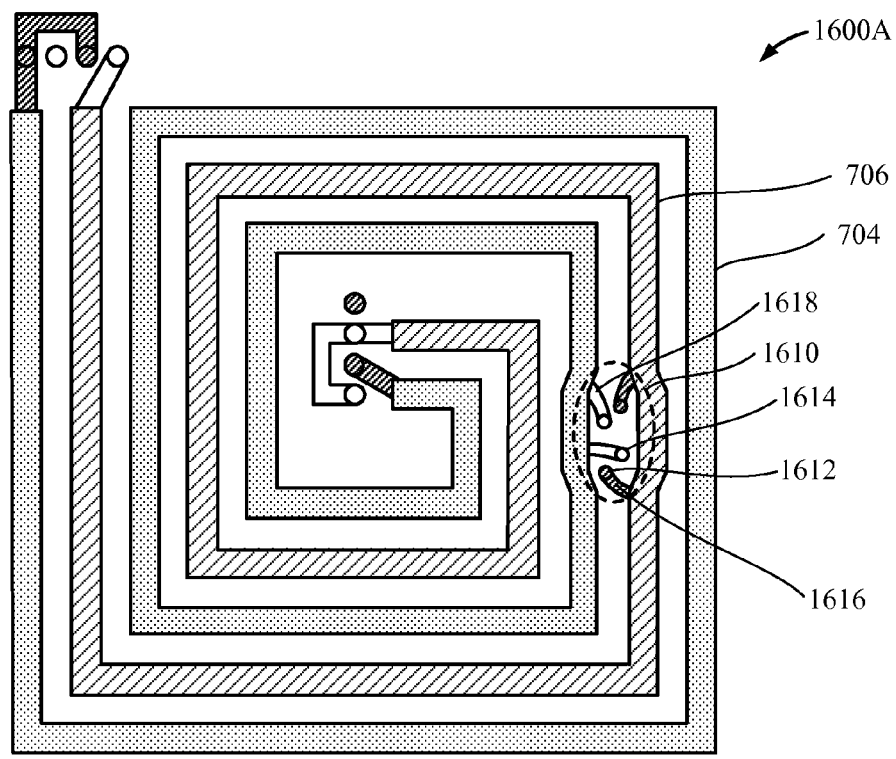
FIG. 16A shows a plan view of one example upper layer connection arrangement of one interior interconnect according to an aspect.
Figure 16B:
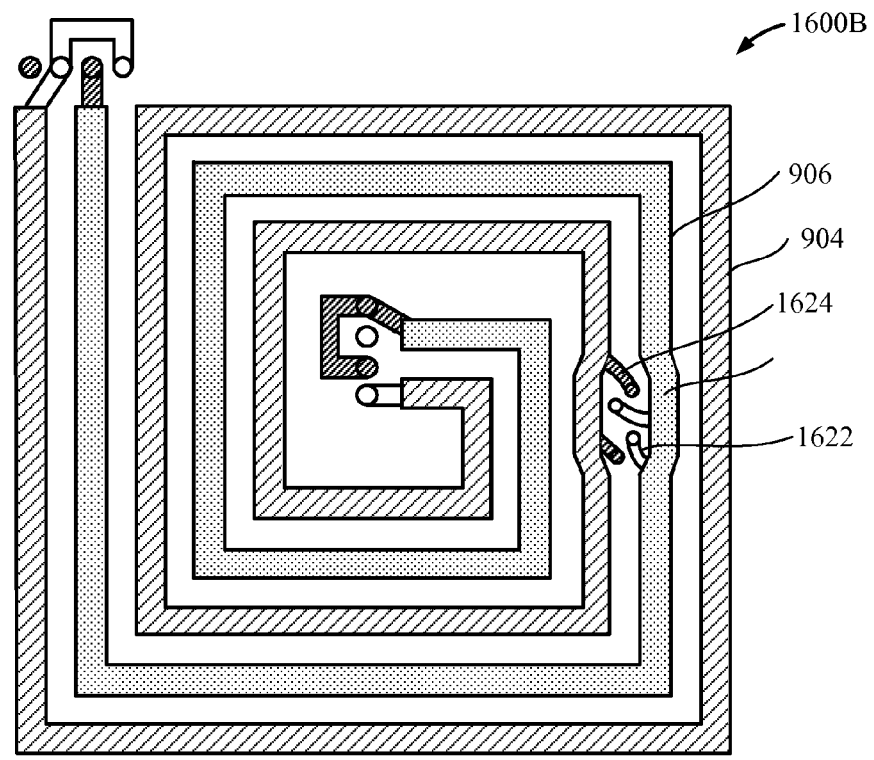
FIG. 16B shows a plan view of one example lower layer connection arrangement of one interior interconnect, complementary to the FIG. 16A example upper layer connection arrangement.

FIG. 16A shows a plan view of one example upper layer connection arrangement 1600A of an interior inter-layer interconnect 1610, in relation to the odd level spiral capacitors 702 of the FIG. 7 MLI capacitor 700. FIG. 16B shows the interior inter-layer interconnect 1610 in relation to the even level spiral capacitors 708 of the FIG. 7 MLI capacitor 700. This is to avoid obfuscating the description with details not specific to the interior inter-layer interconnect 1610. FIGS. 16A and 16B show one instance of the interior inter-layer interconnect 1610 only for purposes of example. Implementations are contemplated having various quantities and arrangements of interior inter-layer interconnects, such as the interior inter-layer interconnect 1610.

Continuing to refer to FIGS. 16A-16B, in an aspect, each instance of the interior inter-layer interconnect 1610 may include one or more, and preferably two more, interior first posts 1612 and a similar quantity of interior second posts 1614. In an aspect, each interior first posts 1612 may couple, for example, through a stub 1616, to one of the first and second spiral winding of the odd level spiral capacitors 702 and, for example, through a stub 1624, to the other of the first and second spiral windings of the even level spiral capacitors 708 In a similar aspect, each of the interior second posts 1614 may couple, for example, through a stub 1618, to the other of the first and second spiral windings of the odd level spiral capacitors 702 and, for example, through a stub 1622, to the other of the first and second spiral windings of the even level spiral capacitors 708.

Figure 17:
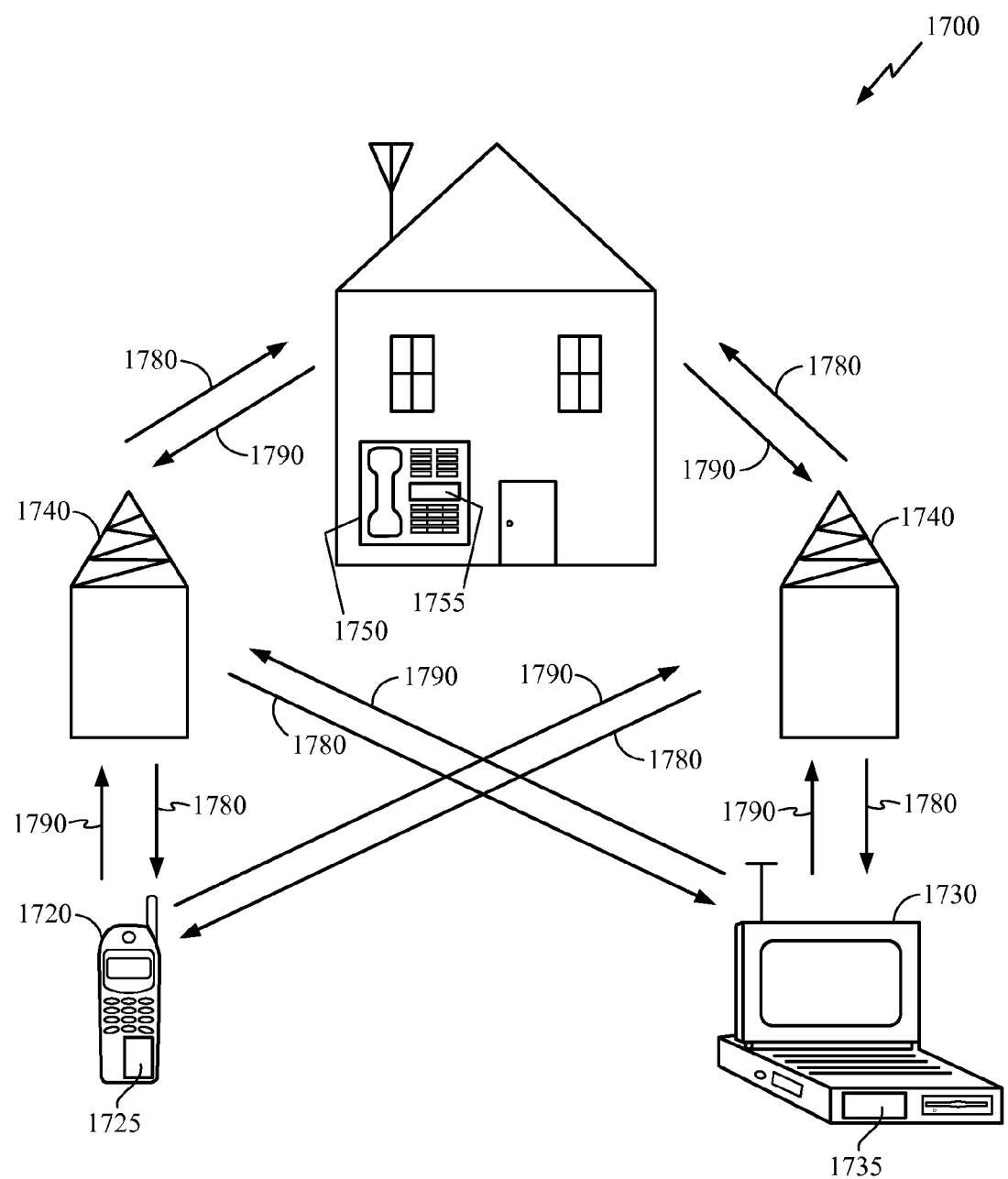
FIG. 17 shows one example functional schematic of one example communication and computing system in accordance with one or more aspects.

FIG. 17 illustrates an exemplary wireless communication system 1700 in which one or more embodiments of the disclosure may be advantageously employed. For purposes of illustration, FIG. 17 shows three remote units 1720, 1730 and 1750 and two base stations 1740. It will be recognized that conventional wireless communication systems may have many more remote units and base stations. The remote units 1720, 1730 and 1750 include integrated circuit or other semiconductor devices 1725, 1735 and 1755 having, in various combinations, multi-layer interconnected capacitors as described hereinabove, for example, as described in reference to FIGS. 1-17. FIG. 17 shows forward link signals 1780 from the base stations 1740 and the remote units 1720, 1730 and 1750 and reverse link signals 1790 from the remote units 1720, 1730, and 1750 to the base stations 1740.

In FIG. 17, the remote unit 1720 is shown as a mobile telephone, the remote unit 1730 is shown as a portable computer, and the remote unit 1750 is shown as a fixed location remote unit in a wireless local loop system. For example, the remote units may be any one or combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 17 illustrates remote units according to the teachings of the disclosure, the disclosure is not limited to these exemplary illustrated units. Embodiments of the disclosure may be suitably employed in any device having active integrated circuitry including various combinations, circuits embodying one or more of the multi-layer interconnected capacitors described hereinabove, for example, as described in reference to FIGS. 1-16.

The foregoing disclosed devices and functionalities, e.g., as described in reference to any one or more of FIGS. 1-16, may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A multi-layer capacitor, comprising:
   a first level planar capacitor, comprising a first level first trace and a first level second trace;
   a dielectric layer, arranged over the first level planar capacitor;
   a second level planar capacitor, arranged over the dielectric layer, comprising a second level first trace and a second level second trace; and
   a bridged-post inter-layer interconnect, comprising
   at least two first posts and at least two second posts, extending through the dielectric layer, adjacent to and outside a perimeter of the first level planar capacitor and a perimeter of the second level planar capacitor,
   a first level first post coupler and a first level second post coupler, under the dielectric layer, wherein the first level first post coupler is configured to couple the at least two first posts together and to the first level first trace, and the first level second post coupler is configured to couple the first level second trace to at least one of the at least two second posts, and
   a second level first post coupler and a second level second post coupler, over the dielectric layer, wherein the second level second post coupler is configured to couple the at least two second posts together and to the second level first trace, and the second level first post coupler is configured to couple the second level first trace to at least one of the at least two first posts.

2. The multi-layer capacitor of claim 1, wherein the first level first trace and the first level second trace are configured to extend adjacent each other, along mutually parallel paths, wherein the mutually parallel paths are in a plane.

3. The multi-layer capacitor of claim 2, wherein the second level first trace is configured in a tracking alignment above the first level first trace, to form a first parallel plate capacitor, and wherein the second level second trace is configured in a tracking alignment above the first level second trace, to form a second parallel plate capacitor.

4. The multi-layer capacitor of claim 1, wherein the first level planar capacitor is a first level spiral capacitor, and the second level planar capacitor is a second level spiral capacitor,
- wherein the first level first trace comprises a first level first spiral winding, the first level second trace comprises a first level second spiral winding, wherein the first level second spiral winding and the first level first spiral winding are interwound around a winding axis,
- wherein the second level first trace comprises a second level first spiral winding, the second level second trace comprises a second level second spiral winding, wherein second level second spiral winding and the second level first spiral winding are interwound around the winding axis, wherein the second level first spiral winding is configured in a tracking alignment with the first level first spiral winding, and the second level second spiral winding is configured in a tracking alignment with the first level second spiral winding.

5. The multi-layer capacitor of claim 4, wherein the first level first spiral winding is a first level first rectangular spiral winding, the first level second spiral winding is a first level second rectangular spiral winding, the second level first spiral winding is a second level first rectangular spiral winding, and the second level second spiral winding is a second level second rectangular spiral winding.

6. The multi-layer capacitor of claim 4, wherein the dielectric layer is a first dielectric layer, wherein the multi-layer capacitor further comprises:
- a third level spiral capacitor, spaced above the second level spiral capacitor by a second dielectric layer, comprising a third level first spiral winding and a third level second spiral winding, wherein the third level first spiral winding and the third level second spiral winding are interwound around the winding axis, wherein the third level first spiral winding is in a tracking alignment above the second level first spiral winding to form a third parallel plate capacitor, and wherein the third level second spiral winding is configured in a tracking alignment above the second level second spiral winding to form a fourth parallel plate capacitor; and
- a fourth level spiral capacitor, spaced above the third level spiral capacitor by a third dielectric layer, comprising a fourth level first spiral winding and a fourth level second spiral winding, wherein the fourth level first spiral winding and the fourth level second spiral winding are interwound around the winding axis, wherein the fourth level first spiral winding is in a tracking alignment with the third level first spiral winding to form a fifth parallel plate capacitor, and wherein the fourth level second spiral winding is configured in a tracking alignment with the third level second spiral winding to form a sixth parallel plate capacitor.

7. The multi-layer capacitor of claim 6, wherein the at least two first posts and the at least two second posts are configured to further extend, normal to the plane, through the second dielectric layer and through the third dielectric layer, and wherein the bridged-post inter-layer interconnect further comprises:
- a third level first post coupler, above the second dielectric layer, configured to couple the at least two first posts together and to the third level first spiral winding,
- a third level second post coupler, configured to couple the third level second spiral winding to at least one of the at least two second posts;
- a fourth level second post coupler, above the third dielectric layer, configured to couple the at least two second posts together and to the fourth level first spiral winding; and
- a fourth level first post coupler, configured to couple the fourth level second spiral winding to at least one of the at least two first posts.

8. The multi-layer capacitor of claim 1, wherein the dielectric layer is a first dielectric layer, and wherein the multi-layer capacitor further comprises a third level planar capacitor, spaced above the second level planar capacitor by a second dielectric layer, wherein the second level planar capacitor comprises a third level first trace and a third level second trace, configured adjacent each other and parallel to the plane,
- wherein the third level first trace is configured in a tracking alignment above the second level first trace to form a third parallel plate capacitor, and
- wherein the third level second trace is configured in a tracking alignment above the second level second trace to form a fourth parallel plate capacitor.

9. The multi-layer capacitor of claim 8, wherein the at least two first posts and the at least two second posts are additionally configured to further extend, normal to the plane, through the second dielectric layer, and wherein the bridged-post inter-layer interconnect further comprises:
- a third level first post coupler, above the second dielectric layer, configured to couple the at least two first posts together and to the third level first trace; and
- a third level second post coupler, above the second dielectric layer, configured to couple the third level second trace to at least one of the at least two second posts.

10. The multi-layer capacitor of claim 1, wherein the first level first trace includes a first level first trace start, and the first level second trace includes a first level second trace start, wherein the first level second trace start is proximal to the first level first trace start, and
- wherein the second level first trace includes a second level first trace start, wherein the second level first trace start is laterally aligned above the first level first trace start, and the second level second trace include a second level second trace start, wherein the second level second trace start is laterally aligned above the first level second trace start.

11. The multi-layer capacitor of claim 10, wherein each of the at least two first posts is proximal to the first level first trace start and to the second level second trace start, and wherein the at least two second posts are proximal to the first level second trace start and to the second level first trace start.

12. The multi-layer capacitor of claim 11, wherein the at least two first posts and the at least two second posts are arranged in an order along a linear axis, wherein the order comprises one of the at least two second posts being adjacent to at least one of the at least two first posts, and another of the at least two first posts being adjacent at least one other of the at least two second posts.

13. The multi-layer capacitor of claim 12, wherein the first level second trace start is laterally spaced from the first level first trace start by a pitch distance, wherein the at least two first posts are each spaced from the first level first trace start by a respective distance, wherein the respective distance is in a range spanning from approximately one-half said pitch distance to approximately said pitch distance.

14. The multi-layer capacitor of claim 11, wherein the first level first post coupler comprises a first level first post bridge and a first level first post stub, wherein the first level first post bridge is configured to couple the at least two first posts together, and the first level first post stub is configured to couple the first level first trace start to at least one of the at least two first posts, wherein the first level second post coupler comprises a first level second post stub, wherein the first level second post stub is configured to couple the first level second trace start to at least one of the at least two second posts, wherein the second level second post coupler comprises a second level second post bridge and a second level second post stub, wherein the second level second post bridge is configured to couple the at least two second posts together, and the second level second post stub is configured to couple the second level first trace start to at least one of the at least two second posts, wherein the second level first post coupler comprises a second level first post stub, wherein the second level first post stub is configured to couple the second level second trace start to at least one of the at least two first posts.

15. The multi-layer capacitor of claim 14, wherein the first level first trace is configured to extend from the first level first trace start to a first level first trace termination, the first level second trace is configured to extend from the first level second trace start to a first level second trace termination, the second level first trace is configured to extend from the second level first trace start to a second level first trace termination, and the second level second trace is configured to extend from the second level second trace start to a second level second trace termination.

16. The multi-layer capacitor of claim 15, wherein the first level second trace termination is proximal to the first level first trace termination, the second level first trace termination is laterally aligned above the first level first trace termination, and the second level second trace termination is laterally aligned above the first level second trace termination.

17. The multi-layer capacitor of claim 16, wherein the first level first trace comprises a first level first spiral winding, configured as winding around a winding axis, wherein the first level second trace comprises a first level second spiral winding, wherein first level second spiral winding is interwound, around the winding axis, with the first level first spiral winding to form the first level planar capacitor as a first level spiral capacitor, wherein the second level first trace comprises a second level first spiral winding, configured as winding around the winding axis, wherein the second level second trace comprises a second level second spiral winding, wherein the second level second spiral winding is interwound, around the winding axis, with the second level first spiral winding to form the second level planar capacitor as a second level spiral capacitor, and wherein the winding axis is approximately aligned with the first level first trace start.

18. The multi-layer capacitor of claim 17, wherein the multi-layer capacitor further comprises a second bridged-post inter-layer interconnect, wherein the second bridged-post inter-layer interconnect comprises:

at least two second interconnect first posts and at least two second interconnect second posts, wherein the at least two second interconnect first posts and the at least two second interconnect second posts are configured to extend normal from the plane, at respective positions that are proximal to the first level first trace start and the first level second trace start;

a second interconnect first level second post bridge, a second interconnect first level first post stub and a second interconnect first level second post stub, extending under the dielectric layer, wherein the second interconnect first level second post bridge is configured to couple the at least two second interconnect second posts together, the second interconnect first level first post stub is configured to couple the first level first trace start to at least one of the at least two second interconnect first posts, and the second interconnect first level second post stub is configured to couple the first level first trace termination to at least one of the at least two second interconnect second posts; and a second interconnect second level first post bridge, a second interconnect second level first post stub and a second interconnect second level second post stub, extending above the dielectric layer, wherein the second interconnect second level first post bridge is configured to couple the at least two second interconnect first posts together, the second interconnect second level first post stub is configured to couple the second level second trace start to at least one of the at least two second interconnect first posts, and the second interconnect second level second post stub is configured to couple the second level first trace start to at least one of the at least two second interconnect second posts.

19. A multi-layer capacitor, comprising:

a first level planar capacitor, comprising a first level first trace and a first level second trace, configured above a plane; and a second level planar capacitor, spaced above the first level planar capacitor by a dielectric layer, comprising a second level first trace and a second level second trace, wherein the second level first trace is aligned above the first level first trace to form a first parallel plate capacitor, and the second level second trace is aligned above the first level second trace to form a second parallel plate capacitor; and a bridged-post inter-layer interconnector, comprising
at least two first posts and at least two second posts, wherein the at least two first posts and the at least two first posts are configured to extend normal to the plane and through the dielectric layer adjacent to and outside a perimeter of the first level planar capacitor and a perimeter of the second level planar capacitor, a first level first post coupler, arranged under the dielectric layer, configured to couple the at least two first posts together and to the first level first trace, a first level second post coupler, arranged under the dielectric layer, configured to couple the first level second trace to at least one of the at least two second posts, a second level second post coupler, arranged above second dielectric layer, configured to couple the at least two second posts together and to the second level first trace, and a second level first post coupler, arranged above second dielectric layer, configured to couple the second level second trace to at least one of the at least two first posts.

20. The multi-layer capacitor of claim 19, wherein the dielectric layer is a first dielectric layer, and wherein the multi-layer capacitor further comprises:

a third level planar capacitor, spaced above the second level planar capacitor by a second dielectric layer, comprising a third level first trace and a third level second trace, wherein the third level first trace is aligned above the second level first trace to form a third parallel plate capacitor, and wherein the third level second trace is aligned above the second level second trace to form a fourth parallel plate capacitor; and a fourth level planar capacitor, spaced above the third level planar capacitor by a third dielectric layer, comprising a fourth level first trace and a fourth level second trace, wherein the fourth level first trace is aligned above the third level first trace to form a fifth parallel plate capacitor, and the fourth level second trace is aligned above the third level second trace to form a sixth parallel plate capacitor, wherein the at least two first posts and the at least two second posts are configured to further extend through the second dielectric layer and through the third dielectric layer, and wherein the bridged-post inter-layer interconnector further comprises a third level first post coupler, arranged above the second dielectric layer, configured to couple the at least two first posts together and to the third level first trace, a third level second post coupler, configured to couple the third level second trace to at least one of the at least two second posts, a fourth level second post coupler, arranged above the third dielectric layer, configured to couple the at least two second posts together and to the fourth level first trace, and a fourth level first post coupler, configured to couple the fourth level second trace to at least one of the at least two first posts.

21. The multi-layer capacitor of claim 20, wherein the first level planar capacitor is a first level spiral capacitor, the first level first trace comprises a first level first spiral winding and the first level second trace comprises a first level second spiral winding, wherein the first level first spiral winding and the first level second spiral winding are interwound around a winding axis, wherein the second level planar capacitor is a second level spiral capacitor, the second level first trace comprises a second level first spiral winding and the second level second trace comprises a second level second spiral winding, wherein the second level first spiral winding is in a tracking alignment above the first level first spiral winding, and the second level second spiral winding is in a tracking alignment above the first level second spiral winding, wherein the third level planar capacitor is a third level spiral capacitor, the third level first trace comprises a third level first spiral winding and the third level second trace comprises a third level second spiral winding, wherein the third level first spiral winding is in a tracking alignment above the second level first spiral winding, and the third level second spiral winding is in a tracking alignment above the second level second spiral winding, and wherein the fourth level planar capacitor is a fourth level spiral capacitor, the fourth level first trace comprises a fourth level first spiral winding and the fourth level second trace comprises a fourth level second spiral winding, wherein the fourth level first spiral winding is in a tracking alignment above the third level first spiral winding, and the fourth level second spiral winding is in a tracking alignment above the third level second spiral winding.

22. The multi-layer capacitor of claim 21, wherein an outer turn of the first level first spiral winding is an outer periphery of the first level spiral capacitor, an outer turn of the second level first spiral winding is an outer periphery of the second level spiral capacitor, an outer turn of the third level first spiral winding is an outer periphery of the third level spiral capacitor, and an outer turn of the fourth level first spiral winding is an outer periphery of the fourth level spiral capacitor, wherein the multi-layer capacitor further comprises a plurality of side inter-layer interconnects, each side inter-layer interconnect configured to connect the outer turn of the first level first spiral winding to the outer turn of the third level first spiral winding, and to connect the outer turn of the second level first spiral winding to the outer turn of the fourth level first spiral winding.

23. The multi-layer capacitor of claim 22, wherein each side inter-layer interconnect comprises:

at least two side first posts and at least two side second posts, each extending normal to the plane and comprising at least two side first posts and the at least two side second posts, wherein the at least two side first posts are configured to extend adjacent the outer turn of the first level first spiral winding and adjacent the outer turn of the third level first spiral winding, and the at least two side second posts are configured to extend adjacent the outer turn of the second level first spiral winding and adjacent the outer turn of the fourth level first spiral winding;

at least two first level side stubs, wherein each of the at least two first level side stubs is configured to couple the outer turn of the first level first spiral winding to at least one of the at least two side first posts;

at least two third level side stubs, wherein each of the at least two third level side stubs is configured to couple the outer turn of the third level first spiral winding to at least one of the at least two side first posts;

at least two second level side stubs, wherein each of the at least two second level side stubs is configured to couple the outer turn of the second level first spiral winding to at least one of the at least two side second posts; and at least two fourth level side stubs, wherein each of the at least two fourth level side stubs is configured to couple the outer turn of the fourth level first spiral winding to at least one of the at least two side second posts.

24. The multi-layer capacitor of claim 21, further comprising at least one interior inter-layer interconnect, wherein the at least one interior inter-layer interconnect is configured to connect an interior turn of the first level first spiral winding to an interior turn of the third level first spiral winding, or to connect an interior turn of the first level second spiral winding to an interior turn of the third level second spiral winding, or both, and wherein the at least one interior inter-layer interconnect is configured to connect an interior turn of the second level first spiral winding to an interior turn of the fourth level first spiral winding, or to connect an interior turn of the second level second spiral winding to an interior turn of the fourth level second spiral winding, or both.

25. A multi-layer capacitor, comprising:

a capacitor stack, wherein the capacitor stack comprises odd level spiral capacitors and even level spiral capacitors, each of the even level spiral capacitors spaced above a corresponding one of the odd level spiral capacitors, wherein each of the odd level spiral capacitors comprises an odd level first spiral winding and an odd level second spiral winding, the odd level first spiral winding and the odd level second spiral winding being interwound about a winding axis, wherein each of the even level spiral capacitors comprises an even level first spiral winding and an even level second spiral winding, the even level first spiral winding and the even level second spiral winding being interwound about the winding axis, and in a tracking alignment with the odd level first spiral winding and the odd level second spiral winding of an underlying one of the odd level spiral capacitors; and a bridged-post inter-layer interconnect, comprising at least two first posts, and at least two second posts, wherein the at least two first posts and the at least two second posts are configured to extend through the respective dielectric layers adjacent to and outside a perimeter of the odd level spiral capacitors and a perimeter of the even level spiral capacitors, wherein the bridged-post inter-layer interconnect further comprises adjacent each of the odd level spiral capacitors, an odd level first post coupler and an odd level second post coupler, wherein the odd level first post coupler is configured to couple the at least two first posts together and to the odd level first spiral winding of the odd level spiral capacitor, and the odd level second post coupler is configured to couple the odd level second spiral winding of the odd level spiral capacitor to at least one of the at least two second posts, and adjacent each of the even level spiral capacitors, an even level first post coupler and an even level second post coupler, wherein the even level second post coupler is configured to couple the at least two second posts together and to the even level first spiral winding of the even level spiral capacitor, and the even level first post coupler is configured to couple the even level second spiral winding of the even level spiral capacitor to at least one of the at least two first posts.

26. The multi-layer capacitor of claim 25, wherein the odd level first spiral winding of each odd level spiral capacitor is configured to extend from an odd level first spiral winding start to an odd level first spiral winding termination, wherein the odd level first spiral winding start is approximately aligned with a winding axis, wherein the winding axis is common to all of the odd level spiral capacitors, and wherein the odd level second spiral winding of each odd level spiral capacitor is configured to extend from an odd level second spiral winding start to an odd level second spiral winding termination, wherein the odd level second spiral winding start is proximal to the odd level first spiral winding start and the odd level second spiral winding termination is proximal to the odd level first spiral winding termination.

27. The multi-layer capacitor of claim 26, wherein the even level first spiral winding of each even level spiral capacitor is configured to extend from an even level first spiral winding start to an even level first spiral winding termination, wherein the even level first spiral winding start is approximately aligned with the winding axis, wherein the winding axis is common to all of the even level spiral capacitors, and wherein the even level second spiral winding of each even level spiral capacitor is configured to extend from an even level second spiral winding start to an even level second spiral winding termination, wherein the even level second spiral winding start is proximal to the even level first spiral winding start and the even level second spiral winding termination is proximal to the even level first spiral winding termination.

28. The multi-layer capacitor of claim 27, wherein the odd level first post coupler comprises an odd level first post bridge and an odd level first post stub, wherein the odd level first post bridge is configured to couple the at least two first posts together, and the odd level first post stub is configured to couple the odd level first spiral winding termination to at least one of the at least two first posts, and wherein the even level second post coupler comprises an even level second post bridge and an even level second post stub, wherein the even level second post bridge is configured to couple the at least two second posts together, and the even level second post stub is configured to couple the even level first spiral winding termination to at least one of the at least two second posts.

29. The multi-layer capacitor of claim 28, wherein the bridged-post inter-layer interconnect is a first bridged-post inter-layer interconnect, and wherein the multi-layer capacitor further comprises a second bridged-post inter-layer interconnect, wherein the second bridged-post inter-layer interconnect comprises at least two second interconnect first posts and at least two second interconnect second posts, and wherein the second bridged-post inter-layer interconnect further comprises adjacent each of the odd level spiral capacitors, a second interconnect odd level first post coupler and a second interconnect odd level second post coupler, wherein the second interconnect odd level second post coupler is configured to couple the at least two second interconnect second posts together and to the odd level second spiral winding start of the odd level spiral capacitor, and the second interconnect odd level first post coupler is configured to couple the odd level first spiral winding start of the odd level spiral capacitor to at least one of the at least two second interconnect first posts, and adjacent each of the even level spiral capacitors, a second interconnect even level first post coupler and a second interconnect even level second post coupler, wherein the second interconnect even level first post coupler is configured to couple the at least two second interconnect first posts together and to the even level first spiral winding start of the even level spiral capacitor, and the second interconnect even level second post coupler is configured to couple the even level second spiral winding start of the even level spiral capacitor to at least one of the at least two second interconnect second posts.

30. A multi-layer capacitor, comprising:

a first level planar capacitor, comprising a first level first trace and a first level second trace, each extending above a plane; and a second level planar capacitor, spaced above the first level planar capacitor by a dielectric layer, comprising a second level first trace and a second level second trace, wherein the second level first trace is aligned above the first level first trace to form a first parallel plate capacitor, and the second level second trace is aligned above the first level second trace to form a second parallel plate capacitor;

a third level planar capacitor, spaced above the second level planar capacitor by a second dielectric layer, comprising a third level first trace and a third level second trace, wherein the third level first trace is aligned above the second level first trace to form a third parallel plate capacitor, and wherein the third level second trace is aligned above the second level second trace to form a fourth parallel plate capacitor;

a fourth level planar capacitor, spaced above the third level planar capacitor by a third dielectric layer, comprising a fourth level first trace and a fourth level second trace, wherein the fourth level first trace is aligned above the third level first trace to form a fifth parallel plate capacitor, and the fourth level second trace is aligned above the third level second trace to form a sixth parallel plate capacitor; and means for coupling, in parallel, the first level planar capacitor, the second level planar capacitor, the first parallel plate capacitor, the second parallel plate capacitor, the third parallel plate capacitor, the fourth parallel plate capacitor, the fifth parallel plate capacitor, and the sixth parallel plate capacitor, the means for coupling adjacent to and outside a perimeter of the first level planar capacitor, a perimeter of the second level planar capacitor, a perimeter of the first parallel plate capacitor, a perimeter of the second parallel plate capacitor, a perimeter of the third parallel plate capacitor, a perimeter of the fourth parallel plate capacitor, a perimeter of the fifth parallel plate capacitor, and a perimeter of the sixth parallel plate capacitor.

\* \* \* \* \*